US012615898B2

(12) United States Patent
Park et al.

(10) Patent No.: US 12,615,898 B2
(45) Date of Patent: Apr. 28, 2026

(54) MASS-TRANSFER METHOD AND MASS-TRANSFER DEVICE FOR MICRO SEMICONDUCTOR CHIPS

(71) Applicant: SAMSUNG ELECTRONICS CO., LTD., Suwon-si (KR)

(72) Inventors: Joonyong Park, Suwon-si (KR); Dongho Kim, Suwon-si (KR); Hyunjoon Kim, Suwon-si (KR); Seogwoo Hong, Suwon-si (KR); Kyungwook Hwang, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 517 days.

(21) Appl. No.: 18/114,039

(22) Filed: Feb. 24, 2023

(65) Prior Publication Data

US 2024/0079395 A1 Mar. 7, 2024

(30) Foreign Application Priority Data

Sep. 6, 2022 (KR) ........................ 10-2022-0113022

(51) Int. Cl.
| | |
|---|---|
| H10H 29/03 | (2025.01) |
| H10P 72/10 | (2026.01) |
| H10W 90/00 | (2026.01) |

(52) U.S. Cl.
CPC ............. H10W 90/00 (2026.01); H10P 72/16 (2026.01)

(58) Field of Classification Search
CPC ........ H10H 29/01; H10H 29/02; H10H 29/03; H10H 29/30; H10H 20/01; H01L 25/13;
(Continued)

(56) References Cited

U.S. PATENT DOCUMENTS 9,478,583 B2 * 10/2016 Hu .......................... H10H 20/84
9,548,332 B2 * 1/2017 Hu ........................ H10H 29/142
(Continued)

FOREIGN PATENT DOCUMENTS

CN 115472725 A * 12/2022 ............. H10H 20/85
EP 4 174 941 A1 5/2023
(Continued)

OTHER PUBLICATIONS

Lin et al. (CN 115472725 A) (Year: 2022).*
(Continued)

*Primary Examiner* — Eduardo A Rodela
(74) *Attorney, Agent, or Firm* — Sughrue Mion, PLLC

(57) ABSTRACT

A method of mass-transferring a plurality of micro semiconductor chips, including mass-transferring a plurality of first micro semiconductor chips onto a first substrate such that they are disposed in a plurality of first grooves of the first substrate; determining whether an empty first groove is present; and positioning a second micro semiconductor chip in the empty first groove, wherein the positioning may include transferring a plurality of second micro semiconductor chips onto a second substrate separate from the first substrate; and adsorbing the second micro semiconductor chip from the second substrate, and positioning the adsorbed second micro semiconductor chip in the empty first groove, using an electrostatic force or an electromagnetic force.

15 Claims, 38 Drawing Sheets

(58) Field of Classification Search

CPC ..... H01L 21/67333; H01L 2224/95085; H01L 2224/95101; H01L 2224/95133; H01L 24/95; H01L 21/6835; H01L 21/68; H01L 2221/68304; H01L 24/97; H01L 21/67144; H01L 24/799; H01L 2924/12041; H10P 72/16; H10P 72/3412; H10P 72/7434

See application file for complete search history.

(56) References Cited

U.S. PATENT DOCUMENTS

| 10,985,302 | B2 | 4/2021 | Sasaki et al. | |
| 11,699,690 | B2 * | 7/2023 | Shih | H01L 22/22 |
| | | | | 257/88 |
| 12,074,583 | B2 * | 8/2024 | Meitl | B41F 16/00 |
| 2006/0220989 | A1 | 10/2006 | Hillis et al. | |
| 2008/0089705 | A1 | 4/2008 | Lu et al. | |
| 2010/0230139 | A1 | 9/2010 | Lu et al. | |
| 2017/0133558 | A1 | 5/2017 | Sasaki et al. | |
| 2018/0012873 | A1 | 1/2018 | Lee et al. | |
| 2018/0342492 | A1 * | 11/2018 | Lu | H01L 22/20 |
| 2020/0006613 | A1 | 1/2020 | Sasaki et al. | |
| 2020/0168661 | A1 * | 5/2020 | Xue | H01L 25/0753 |
| 2021/0005520 | A1 | 1/2021 | Ishio et al. | |
| 2021/0272935 | A1 | 9/2021 | Wang et al. | |
| 2021/0343567 | A1 * | 11/2021 | Han | H10H 20/857 |
| 2022/0013400 | A1 | 1/2022 | Hwang et al. | |
| 2022/0367757 | A1 | 11/2022 | Moon et al. | |
| 2024/0178195 | A1 | 5/2024 | Hwang et al. | |

FOREIGN PATENT DOCUMENTS

| KR | 10-2019-0118992 A | 10/2019 |
| KR | 10-2022-0112188 A | 8/2022 |
| WO | 2021/261627 A1 | 12/2021 |

OTHER PUBLICATIONS

Communication issued Jul. 16, 2024 by the Korean Intellectual Property Office in Korean Patent Application No. 10-2022-0113022.

Jiayi Li et al., "Micro-LED Mass Transfer Technologies", 2020 21st International Conference on Electronic Packaging Technology (ICEPT), Aug. 2020, 3 pages.

Communication issued on Sep. 1, 2023 by the European Patent Office for European Patent Application No. 23159079.5.

* cited by examiner

MASS-TRANSFER METHOD AND MASS-TRANSFER DEVICE FOR MICRO SEMICONDUCTOR CHIPS

CROSS-REFERENCE TO RELATED APPLICATION

This application is based on and claims priority under 35 U.S.C. § 119 to Korean Patent Application No. 10-2022-0113022, filed on Sep. 6, 2022, in the Korean Intellectual Property Office, the disclosure of which is incorporated by reference herein in its entirety.

BACKGROUND

1. Field

The disclosure relates to a mass-transfer method and a mass-transfer device for micro semiconductor chips.

2. Description of the Related Art

The industrial demand for light-emitting diodes (LEDs) has increased because of their advantages of low power consumption and eco-friendliness. LEDs may be used for lighting devices, liquid crystal display (LCD) backlights pixels of display apparatuses. A micro LED display apparatus may use a micro-sized LED chip as a pixel. In manufacturing a display apparatus including a micro-sized LED chip, a laser lift off or pick and place method may be used to transfer the micro LED. However, in these methods, as the size of the micro LED decreases and the size of the display apparatus increases, productivity may be lowered.

SUMMARY

Provided are a mass-transfer method and device of micro semiconductor chips capable of improving a transfer yield in a mass-transfer process of the micro semiconductor chip.

Additional aspects will be set forth in part in the description which follows and, in part, will be apparent from the description, or may be learned by practice of the presented embodiments of the disclosure.

According to an aspect of the disclosure, a mass-transfer method of mass-transferring a plurality of micro semiconductor chips includes mass-transferring a plurality of first micro semiconductor chips onto a first substrate such that the plurality of first micro semiconductor chips are disposed in a plurality of first grooves of the first substrate; determining whether an empty first groove is present in the first substrate, wherein the plurality of first micro semiconductor chips are not disposed in the plurality of first grooves; and positioning a second micro semiconductor chip in the empty first groove, wherein the second micro semiconductor chip is identical to a first micro semiconductor chip from among the plurality of first micro semiconductor chips, wherein the positioning may include transferring a plurality of second micro semiconductor chips onto a second substrate separate from the first substrate, wherein the second micro semiconductor chip is included in the plurality of second micro semiconductor chips; and adsorbing the second micro semiconductor chip from the second substrate, and positioning the adsorbed second micro semiconductor chip in the empty first groove, using an electrostatic force or an electromagnetic force.

The plurality of first micro semiconductor chips may be transferred onto the first substrate by a fluidic self assembly method, and the plurality of second micro semiconductor chips may be transferred onto the second substrate by the fluidic self assembly method.

An upper surface of the first micro semiconductor chip may have a different interfacial energy than a lower surface of the first micro semiconductor chip, and an upper surface of the second micro semiconductor chip may have the different interfacial energy than a lower surface of the second micro semiconductor chip, the first micro semiconductor chip may be disposed in a first groove of the plurality of first grooves such that the upper surface of the second micro semiconductor chip faces in a first direction, and the second micro semiconductor chip may be positioned in the empty first groove such that the upper surface of the second micro semiconductor chip faces in the first direction.

The determining may include detecting first information about the empty first groove, and the second micro semiconductor chip may be positioned in the empty first groove based on the detected first information.

The positioning may include: adsorbing at least some of the plurality of second micro semiconductor chips to a specific region of an electromagnetic array using the electrostatic force or the electromagnetic force selectively generated in the specific region by the electromagnetic array, and separating the second micro semiconductor chip from the electromagnetic array such that the second micro semiconductor chip is positioned in the empty first groove of the first substrate.

The adsorbing may include: aligning the electromagnetic array on the second substrate, and selectively generating the electrostatic force or the electromagnetic force in regions corresponding to the empty first groove, based on the detected first information.

The separating of the second micro semiconductor chip may include: aligning the electromagnetic array and the first substrate such that the second micro semiconductor chip adsorbed to the electromagnetic array is opposed to the empty first groove, and positioning the adsorbed second micro semiconductor chip in the empty first groove by removing the electrostatic force or the electromagnetic force generated in the electromagnetic array.

The adsorbing of the at least some of the plurality of second micro semiconductor chips may include: aligning the electromagnetic array on the second substrate, adsorbing the plurality of second micro semiconductor chips transferred onto the second substrate, by generating the electrostatic force or the electromagnetic force in an entire region of the electromagnetic array, inverting the electromagnetic array such that the adsorbed plurality of second micro semiconductor chips face upward, and rearranging the plurality of second micro semiconductor chips by selectively generating the electrostatic force or the electromagnetic force in a region corresponding to the empty first groove of the electromagnetic array, based on the detected first information.

The mass-transfer method may further include transferring the plurality of first micro semiconductor chips and the second micro semiconductor chip from the first substrate onto a driving substrate.

After the mass-transferring, a misplaced first micro semiconductor chip may be disposed on a region of the first substrate other than the plurality of first grooves, and the method further may include removing the misplaced first micro semiconductor chip using the electromagnetic array.

The first substrate may include a barrier rib defining the plurality of first grooves, the misplaced first micro semiconductor chip may be transferred onto the barrier rib during the mass-transferring, and the method further may include selectively removing the misplaced first micro semiconductor chip from the barrier rib using the electromagnetic array by generating the electrostatic force or the electromagnetic force in a region of the electromagnetic array overlapping the barrier rib.

A size of each micro semiconductor chip of the plurality of first micro semiconductor chips and the plurality of second micro semiconductor chips may be equal to or less than about 1,000 μm.

Each micro semiconductor chip of the plurality of first micro semiconductor chips and the plurality of second micro semiconductor chips may be a micro light emitting diode.

The first substrate may include a transfer substrate or a driving substrate.

According to an aspect of the disclosure, a transfer structure includes a first substrate including a plurality of first grooves; a plurality of first micro semiconductor chips mass-transferred onto the first substrate such that the plurality of first micro semiconductor chips are disposed in a plurality of first grooves of the first substrate; and a second micro semiconductor chip positioned in a first groove of the plurality of first grooves, wherein the first groove was left empty after the mass-transferring, wherein the second micro semiconductor chip is identical to a first micro semiconductor chip from among the plurality of first micro semiconductor chips, wherein the second micro semiconductor chip was positioned in the first groove by transferring a plurality of second micro semiconductor chips onto a second substrate separate from the first substrate, wherein the second micro semiconductor chip was included in the plurality of second micro semiconductor chips, adsorbing the second micro semiconductor chip from the second substrate, and positioning the adsorbed second micro semiconductor chip in the first groove, using an electrostatic force or an electromagnetic force.

According to an aspect of the disclosure, a mass-transfer apparatus for a plurality of micro semiconductor chips includes a transfer device configured to mass-transfer the plurality of micro semiconductor chips onto a substrate such that the plurality of micro semiconductor chips are disposed in a plurality of grooves by fluidic self assembly; and an electromagnetic array configured to selectively adsorb and separate the plurality of micro semiconductor chips, using an electrostatic force or an electromagnetic force, wherein the electromagnetic array is further configured to operate using: a cleaning mode in which the electromagnetic array is configured to selectively generate the electrostatic force or the electromagnetic force in a region corresponding to barrier ribs defining the plurality of grooves in the substrate to adsorb a misplaced micro semiconductor chip which is transferred onto the barrier ribs, and a complementary mode in which the electromagnetic array is configured to generate the electrostatic force or the electromagnetic force in a region corresponding to at least some of the plurality of grooves in the substrate to adsorb at least one micro semiconductor chip transferred to the plurality of grooves, and to use the adsorbed at least one micro semiconductor chip to complement another substrate.

The electromagnetic array may include a plurality of unit cells arranged in two dimensions, and the plurality of unit cells may be configured to individually generate the electrostatic force or the electromagnetic force.

The mass-transfer apparatus may further include a vision detection module configured to detect information about an empty groove into which the plurality of micro semiconductor chips are not inserted.

The transfer module may include: a supply member configured to supply the plurality of micro semiconductor chips simultaneously with or separately from a liquid; and an absorption member configured to absorb the liquid.

A size of each micro semiconductor chip of the plurality of micro semiconductor chips may be less than or equal to about 1,000 μm.

According to an aspect of the disclosure, method of transferring a plurality of micro semiconductor chips includes mass-transferring a plurality of first micro semiconductor chips into a plurality of first grooves of the first substrate; detecting an empty first groove of the first substrate, wherein the plurality of first micro semiconductor chips are not disposed in the plurality of first grooves; and mass-transferring at least one second micro semiconductor chip onto a second substrate separate from the first substrate; adsorbing the at least one second micro semiconductor chip from the second substrate onto an electromagnetic array; aligning the electromagnetic array with the first substrate such that the adsorbed at least one second micro semiconductor chip is aligned with the empty first groove; and releasing the at least one second micro semiconductor chip from the electromagnetic array such that the at least one second micro semiconductor chip is placed into the empty first groove of the first substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
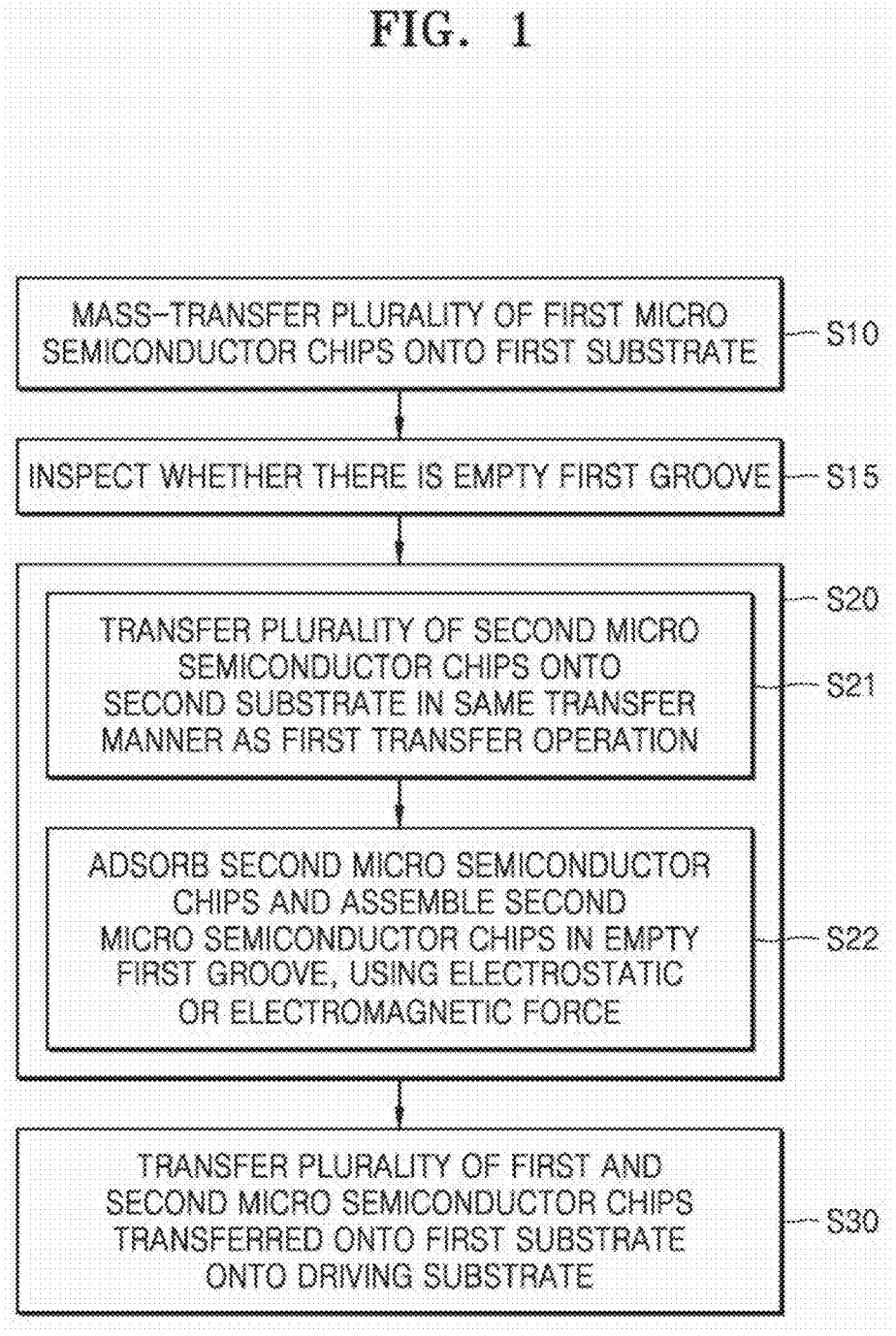
FIG. 1 is a flowchart illustrating a mass-transfer method for a plurality of first micro semiconductor chips according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a mass-transfer method of a plurality of micro semiconductor chips and a mass-transfer device of the micro semiconductor chips will be described in detail with reference to the accompanying drawings. Like reference numerals denote like elements throughout, and in the drawings, sizes of elements may be exaggerated for clarity and convenience of explanation. It will be understood that although the terms "first," "second," etc. may be used herein to describe various elements, these elements should not be limited by these terms. These terms are only used to distinguish one element from another.

The singular forms "a," "an," and "the" are intended to include the plural forms as well, unless the context clearly indicates otherwise. When a portion "includes" an element, another element may be further included, rather than excluding the existence of the other element, unless otherwise described. Sizes or thicknesses of elements may be exaggerated for clarity of explanation. It will also be understood that when a material layer is referred to as being "on" another layer or a substrate, the material layer may be directly on the other layer or the substrate, or intervening layers may also be present therebetween. A material of each layer in the following embodiments is an example, and thus other materials may be used.

Specific execution methods described in the present embodiment are examples, and a technical scope is not limited by any method. For the sake of brevity, conventional electronics, control systems, software, and other functional aspects of the systems may not be described in detail. Also, lines or members connecting elements illustrated in the drawings are merely illustrative of functional connections and/or physical or circuit connections. In an actual device, the connections between components may be represented by various functional connections, physical connections, or circuit connections that are replaceable or added.

The use of the terms "a" and "an," and "the" and similar referents in the context of describing the present disclosure is to be construed to cover both the singular and the plural.

The operations of all methods described herein may be performed in any suitable order unless otherwise indicated herein or otherwise clearly contradicted by context. The use of any and all examples, or exemplary language (e.g., "such as") provided herein, is intended merely to better illuminate the present disclosure and does not pose a limitation on the scope of the present disclosure unless otherwise claimed.

FIG. 1 is a flowchart illustrating a mass-transfer method of a plurality of first micro semiconductor chips M1 according to an embodiment. Referring to FIG. 1, the mass-transfer method of the plurality of first micro semiconductor chips M1 according to an embodiment includes an operation S10 of mass-transferring a plurality of first micro semiconductor chips M1 onto a first substrate 10. Here, the term mass-transfer may be used to refer to a transfer that is not an individual transfer one by one. In embodiments, the term mass-transfer may be used to refer to a transfer of 2 or more, 10 or more, 50 or more, 100 or more micro semiconductor chips through one process.

The plurality of first micro semiconductor chips M1 may be mass-transferred to the first substrate 10 by a fluidic self assembly method.

Figures 2, 3:
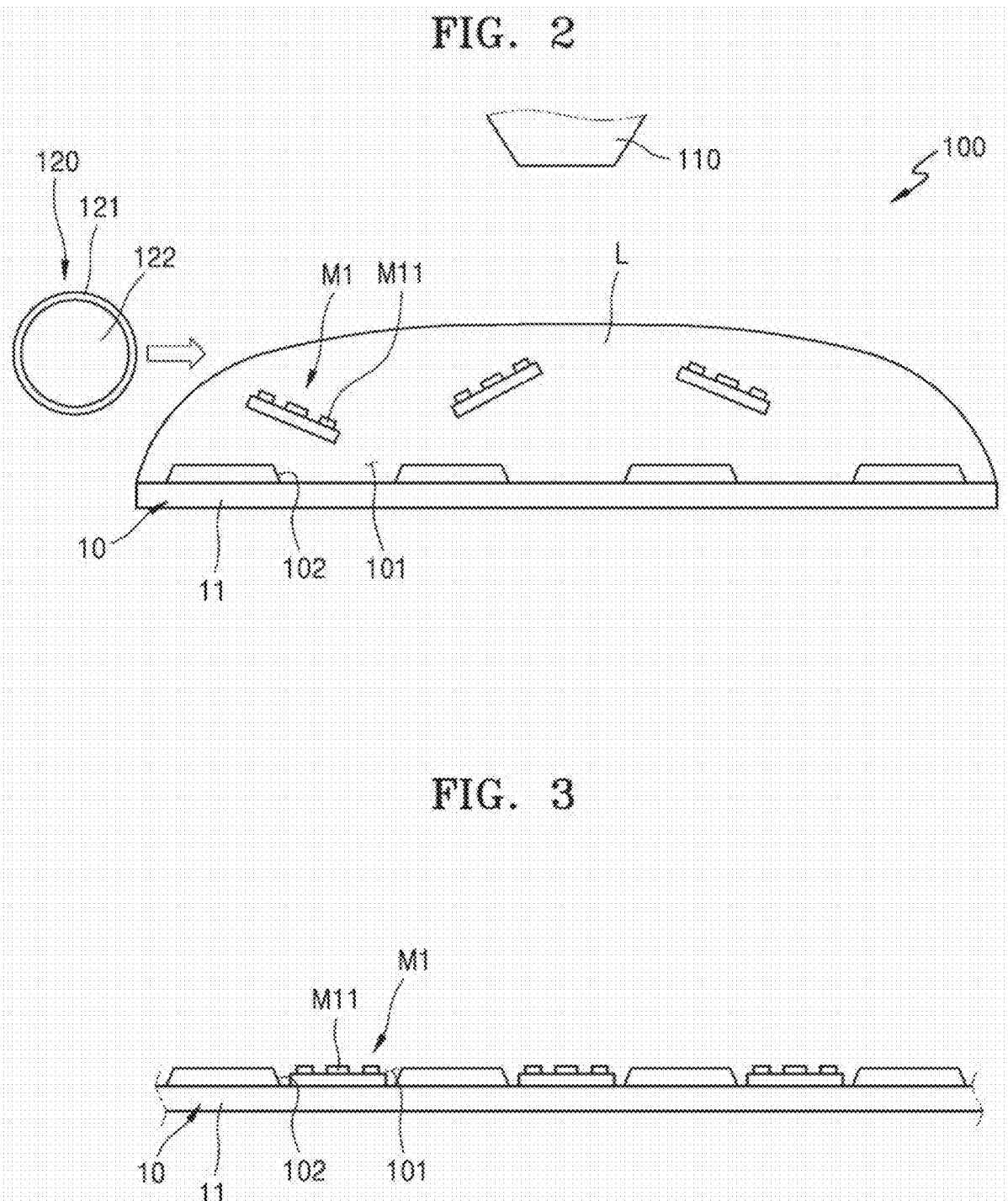
FIGS. 2 to 3 are cross-sectional views illustrating a process of mass-transferring a plurality of first micro semiconductor chips by a fluidic self assembly method according to embodiments.
Figure 4:
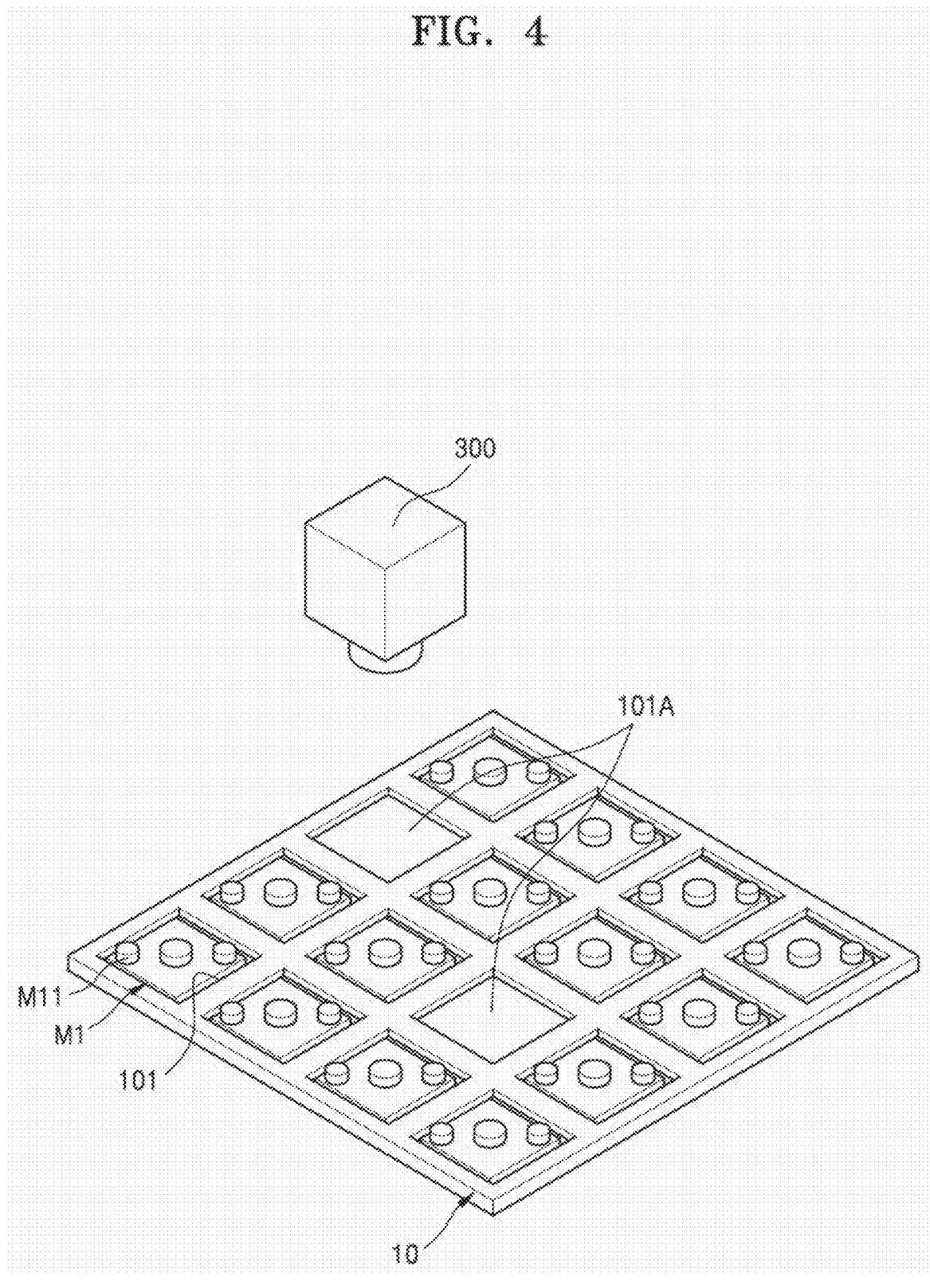
FIG. 4 is a perspective view schematically illustrating a plurality of first micro semiconductor chips which are mass-transferred onto a first substrate according to an embodiment.

FIGS. 2 to 3 are cross-sectional views illustrating a process of mass-transferring the plurality of first micro semiconductor chips M1 by a fluidic self assembly method, and FIG. 4 is a perspective view schematically illustrating the plurality of first micro semiconductor chips M1 which are mass-transferred onto the first substrate 10.

Referring to FIG. 2, the plurality of first micro semiconductor chips M1 and a liquid L may be supplied by a transfer module 100. The transfer module 100 may include a supply member 110 configured to supply the plurality of first micro semiconductor chips M1 and the liquid L. The supply member 110 may supply the plurality of first micro semiconductor chips M1 and the liquid L simultaneously or separately.

The first substrate 10 may include a plurality of first grooves 101. The first substrate 10 may be a transfer substrate 11 aligning the plurality of first micro semiconductor chips M1. However, the first substrate 10 is not limited thereto, and may be a driving substrate that drives the plurality of first micro semiconductor chips M1. The plurality of first grooves 101 may be a space for arranging the plurality of first micro semiconductor chips M1. Barrier ribs 102 defining the plurality of first grooves 101 may be disposed on the first substrate 10. The barrier ribs 102 may be disposed between the first grooves 101.

The first micro semiconductor chip M1 may be a member having a size in a micrometer or nanometer range. For example, the first micro semiconductor chip M1 may be a member having a size equal to or less than 1000 μm, for example, equal to or less than 500 μm, equal to or less than 200 μm, or equal to or less than 100 μm.

For example, the first micro semiconductor chip M1 may be a micro light emitting diode. However, the type of the first micro semiconductor chip M1 is not limited thereto, and may be any type of semiconductor chip which is capable of growing on a substrate including a group IV material, a group III-V material, or sapphire. An example of the group IV material may use silicon. Examples of the group III-V material may use indium phosphide (InP) and gallium arsenic (GaAS).

The first micro semiconductor chip M1 may include at least one of a light emitting diode, a laser, or a detector. The detector may be an infrared sensor. For example, the detector may be a short-wave infrared (SWIR) sensor or a long-wave infrared (LWIR) sensor.

Any liquid which does not significantly corrode or damage the first micro semiconductor chip M1 may be used as the liquid L. The liquid L may include, for example, one of groups including water, ethanol, alcohol, polyol, ketone, halocarbon, acetone, flux and an organic solvent, or a plurality of combinations. The organic solvent may include, for example, isopropyl alcohol (IPA). The available liquid L is not limited thereto and may be changed in various ways.

The liquid L may be supplied to the first groove 101 in various ways, for example using a spray method, a dispensing method, an inkjet dot method, a method of flowing the liquid L to the first substrate 10, etc. The liquid L may be adjusted in various ways to fit the first groove 101 or to overflow from the first groove 101.

The first micro semiconductor chip M1 may be sprayed directly on the first substrate 10 without the liquid L or may be supplied while being included in a suspension. The first micro semiconductor chip M1 included in the suspension may be supplied in various ways, for example using a spray method, a dispensing method of dropping the liquid L in a drop, an inkjet dot method of discharging the liquid L like a printing method, a method of flowing the suspension onto the first substrate 10, etc.

Next, each of the plurality of first micro semiconductor chips M1 may be assembled into the first groove 101 by the transfer module 100. As an example in this regard, the transfer module 100 may include a chip alignment member 120 aligning the first micro semiconductor chip M1 in the first groove 101. The chip alignment member 120 may include an absorption member 121 that may absorb the liquid L. The absorption member 121 may be moved to scan the first substrate 10. The absorption member 121 may be a material capable of absorbing the liquid L, and its shape or structure is not limited. The absorption member 121 may include, for example, fabrics, tissues, polyester fibers, paper or wipers, etc. The absorption member 121 may be used alone without any other auxiliary instrument, but is not limited thereto, and may be coupled to a support 122 in order to conveniently scan the first substrate 10. The support 122 may have various forms and structures suitable for scanning the first substrate 10. The support 122 may have a form, for example, such as a rod, a blade, a plate, or a wiper. The absorption member 121 may be provided on a side of the support 122, or may surround the circumference of the support 122.

The absorption member 121 may scan the first substrate 10 while pressing the first substrate 10 with appropriate pressure. Scanning may include absorbing the liquid L as the absorption member 121 contacts the first substrate 10 and passes through or along the plurality of first grooves 101. Scanning may be performed in various ways in, for example, a sliding method of the absorption member 121, a rotating method, a translating motion method, a reciprocating motion method, a rolling method, a spinning method, and/or a rubbing method, and may include both a regular method and an irregular method. Instead of moving the absorption member 121, scanning may be performed by moving the first substrate 10, and scanning of the first substrate 10 may also be performed in the sliding method, the rotating method, the translating motion method, the reciprocating motion method, the rolling method, the spinning method, and/or the rubbing method. Scanning may also be performed in cooperation with the absorption member 121 and the first substrate 10.

In this way, the plurality of first micro semiconductor chips M1 may be respectively disposed in the plurality of first grooves 101 of the first substrate 10, by supplying the plurality of first micro semiconductor chip M1 together with the liquid L to the first substrate 10, and applying external force to the plurality of micro semiconductor chips M1 through the absorption member 121, etc. The plurality of first micro semiconductor chips M1 may be respectively disposed in the plurality of first grooves 101 of the first substrate 10, by removing the liquid L.

Referring to FIG. 3, the plurality of first micro semiconductor chips M1 disposed in the plurality of first grooves 101 may be spaced apart from each other by a certain space. The plurality of first micro semiconductor chips M1 may be assembled into the plurality of first grooves 101 of the first substrate 10 by themselves in a constant direction by interfacial energy. For example, the first micro semiconductor chip M1 may include an upper surface and a surface having different interfacial energy. As an example, the first micro semiconductor chip M1 may be disposed so that a first electrode layer M11 faces upward. First and second electrodes having different polarities may be disposed in the first electrode layer M11. In this case, the first micro semiconductor chip M1 may have a horizontal electrode structure.

However, the structure of the first micro semiconductor chip M1 is not limited thereto, and may be changed in various ways when the structure has different interfacial energy of the upper and surfaces. For example, although not shown, the first micro semiconductor chip M1 may have a vertical electrode structure in which electrodes are disposed on the upper and lower portions thereof. For example, although not shown, an upper electrode may be disposed on one surface of the first micro semiconductor chip M1, and a lower electrode having different interfacial energy from that of the upper electrode may be disposed on the other surface thereof. In order to have different interfacial energy, the upper and lower electrodes may have different materials or different structures. For example, the area of the upper electrode may be different from the area of the lower electrode. In this case, the first micro semiconductor chip M1 may be disposed in the first groove 101 so that the upper electrode faces upward and the lower electrode faces downward.

In embodiments, because the first micro semiconductor chips M1 are not disposed one by one in each of the plurality of first grooves 101 by the fluidic self assembly method, the first micro semiconductor chips M1 may not be properly inserted into some of the plurality of first grooves 101. For example, because the plurality of first micro semiconductor chips M1 are mass-supplied on, or mass-transferred onto, the first substrate 10, and then disposed in the first grooves 101 by using the absorption member 121 by the fluidic self assembly method, the first micro semiconductor chips M1 may be partially inserted into some of the first grooves 101, or may not be inserted at all into the first grooves 101.

Referring to FIGS. 1 and 4, the first micro semiconductor chips M1 may be inserted into most of the first grooves 101 of the first substrate 10 onto which the first micro semiconductor chips M1 are mass-transferred but, the first micro semiconductor chips M1 may be not inserted into some of the first grooves 101, therefore leaving some of the first grooves 101 empty, for example as empty first grooves 101A. That is, an empty first groove 101A into which the first micro semiconductor chip M1 is not inserted may be present in the first substrate 10.

Referring to FIGS. 1 and 4, at operation S15 a vision detection module 300 may inspect whether at least one empty first groove 101A, in which the first micro semiconductor chip M1 is not assembled, is present among the plurality of first grooves 101. In embodiments, the vision detection module 300 may be referred to as, for example, a camera, an image sensor, or a sensor.

The empty first groove 101A of the first substrate 10 may be detected by the vision detection module 300. The vision detection module 300 may detect first information about the empty first groove 101A to which the first micro semiconductor chips M1 is not transferred from the first substrate 10. The vision detection module 300 may include a vision camera capable of optical capturing of images or data. The vision camera may capture images of, or data about, the first substrate 10 onto which the plurality of first micro semiconductor chips M1 are transferred by the fluidic self assembly method. The vision detection module 300 may detect the first information about a position of the empty first groove 101A on the first substrate 10 based on images or data captured by the vision camera.

Figure 5:
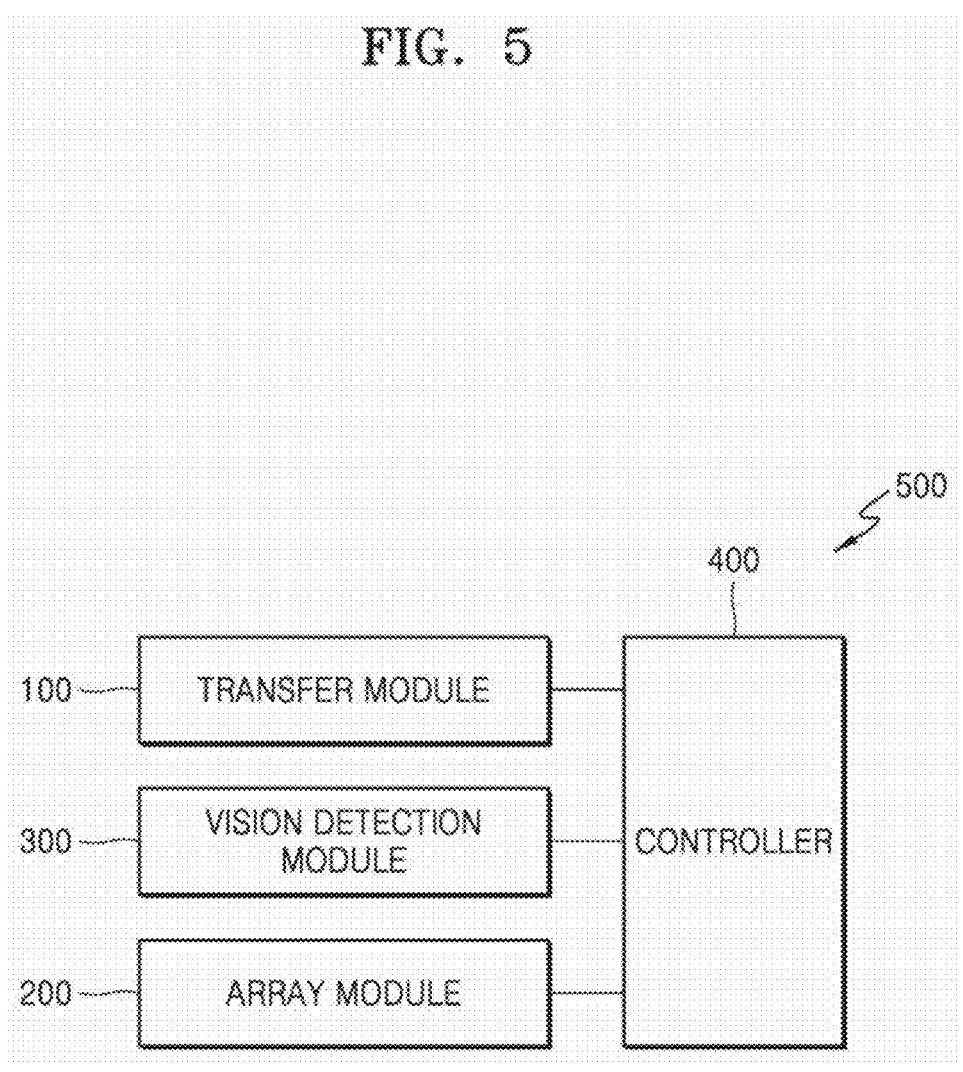
FIG. 5 is a block diagram illustrating a device for complementing a mass-transfer of micro semiconductor chips according to an embodiment.

FIG. 5 is a block diagram illustrating a device 500 for complementing the mass-transfer of micro semiconductor chips according to an embodiment. Referring to FIGS. 1 and 5, a method of complementing the mass-transfer of micro semiconductor chips according to an embodiment may include an operation S20 of complementing the empty first groove 101A by assembling a second micro semiconductor chip M2 which may be substantially similar or identical to the first micro semiconductor chip M1 in the empty first groove 101A among the plurality of first grooves 101, considering that the empty first groove 101A may be generated in the first substrate 10 during a mass-transfer process such as a fluidic self assembly method.

Operation S20 of complementing the empty first groove 101A may include an operation S21 of transferring the second micro semiconductor chip M2 onto a second substrate 20 separately from the first substrate 10, in the same manner as the transfer method of the first substrate 10, and operation S22 of assembling the second micro semiconductor chip M2 in the empty first groove 101A using an electrostatic or electromagnetic force. In embodiments, as shown in FIG. 5, the device 500 for complementing the mass-transfer of micro semiconductor chips may include a transfer module 100 and an array module 200. In embodiments, the transfer module 100 may be referred to as a transfer device, and the array module may be referred to as an electromagnetic array In embodiments, the device 500 for complementing the mass-transfer may further include the vision detection module 300 and a controller 400.

Figure 6A:
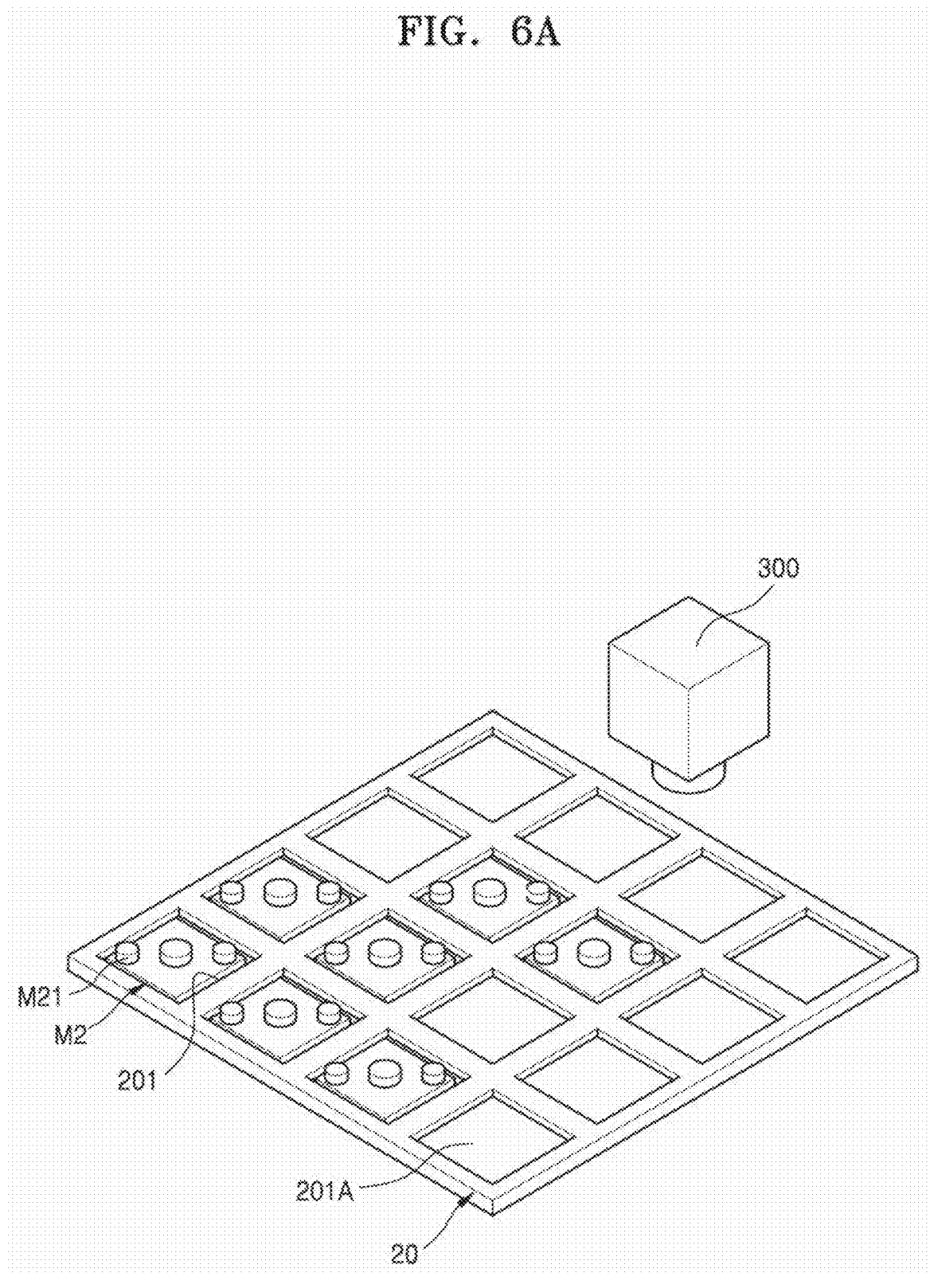
FIGS. 6A to 6E are diagrams illustrating a complementing operation according to an embodiment.
Figure 9:
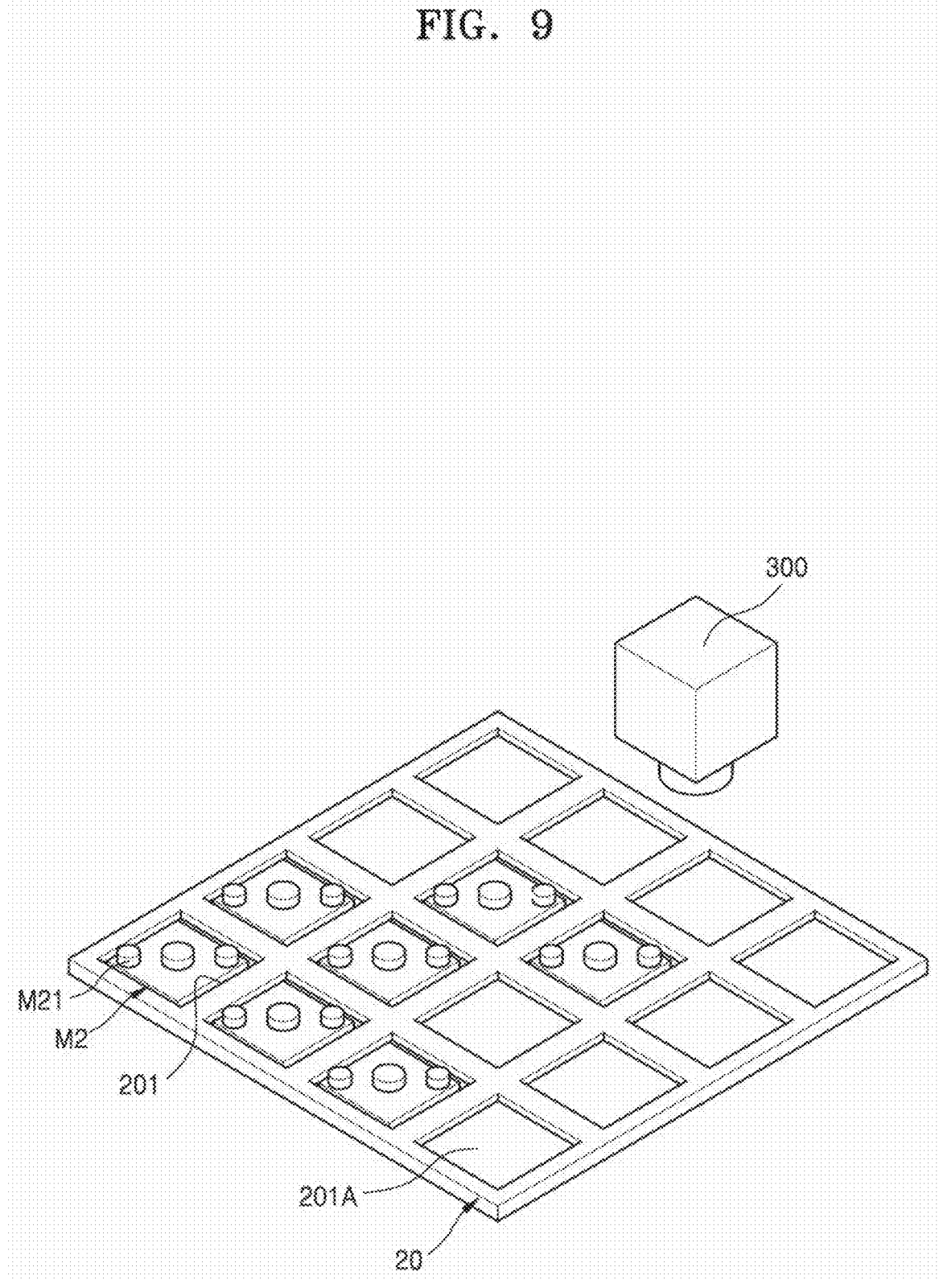
FIG. 9 is a perspective view illustrating a second micro semiconductor chip transferred onto a second substrate by the transfer process of FIG. 8 according to an embodiment.

FIGS. 6A to 6E are diagrams illustrating operation S20 of complementing the empty first groove 101A according to an embodiment. FIG. 7 is a block diagram schematically showing the transfer module 100 used in FIG. 6A, FIG. 8 is a cross-sectional view illustrating a process of transferring the second micro semiconductor chip M2 onto the second substrate 20 by the transfer module 100 of FIG. 7, and FIG. 9 is a perspective view illustrating the second micro semiconductor chip M2 transferred onto the second substrate 20 by the transfer process of FIG. 8, according to embodiments.

Referring to FIGS. 1 and 6A, at operation S21 the second micro semiconductor chip M2 may be transferred onto the second substrate 20 separately from the first substrate 10 in the same manner as the transfer method of the first substrate 10. For example, when the first micro semiconductor chip M1 is transferred onto the first substrate 10 by a fluidic self assembly method, the second micro semiconductor chip M2 may also be transferred onto the second substrate 20 by the fluidic self assembly method.

Referring to FIGS. 7 and 8, the transfer module 100 may include the supply member 110 which may supply the liquid L and the plurality of second micro semiconductor chips M2 on the second substrate 20 and the chip alignment member 120 which may align the second micro semiconductor chip M2 assembled in the second groove 201.

The transfer module 100 may be the same as the transfer module 100 used in the first transfer operation S10. However, the transfer module 100 is not necessarily limited thereto, and may be the transfer module 100 separately from the transfer module 100 used in the first transfer operation S10. The supply member 110 may supply the plurality of second micro semiconductor chips M2 and the liquid L simultaneously or individually.

The second substrate 20 may include the plurality of second grooves 201. The second substrate 20 may be a substrate for aligning the second micro semiconductor chip M2 to complement, or to be complementary to, the first substrate 10. The plurality of second grooves 201 may be a space in which the second micro semiconductor chip M2 may be disposed. The second groove 201 of the second substrate 20 may have the same size and arrangement as the second groove 201 of the first substrate 10. The barrier ribs 102 defining the plurality of second grooves 201 may be disposed on the second substrate 20. The barrier ribs 102 may be disposed between the second grooves 201. The number of the second grooves 201 supplied to the second substrate 20 may be the same as, or different from, the number of the first grooves 101 supplied to the first substrate 10.

The second micro semiconductor chip M2 may have the same size as the first micro semiconductor chip M1. The second micro semiconductor chip M2 may be a member having a size in a micrometer or nanometer range. For example, the second micro semiconductor chip M2 may be a member having a size equal to or less than 1000 µm, for example, equal to or less than 500 µm, equal to or less than 200 µm, or equal to or less than 100 µm.

The second micro semiconductor chip M2 may have the same structure as the first micro semiconductor chip M1. The second micro semiconductor chip M2 may include a second electrode layer M21 disposed on one surface thereof. The second micro semiconductor chip M2 may be a micro light emitting diode. However, the type of the second micro semiconductor chip M2 is not limited thereto, and may be any type of semiconductor chip which is capable of growing on a substrate including a group IV material, a group III-V material, or sapphire. An example of the group IV material may use silicon. Examples of the group III-V material may use InP and GaAs.

The second micro semiconductor chip M2 may include at least one of a light emitting diode, a laser, or a detector. The detector may be an infrared sensor. For example, the detector may be a SWIR sensor or a LWIR sensor.

Any kind of liquid may be used as the liquid L as long as it does not corrode or damage the second micro semiconductor chip M2. The liquid L may include, for example, one of groups including water, ethanol, alcohol, polyol, ketone, halocarbon, acetone, flux and an organic solvent or a plurality of combinations. The organic solvent may include, for example, IPA. The available liquid L is not limited thereto and may be changed in various ways.

A method of supplying the liquid L to the second groove 201 may use in various ways, for example, a spray method, a dispensing method, an inkjet dot method, a method of flowing the liquid L to the second substrate 20, etc. The liquid L may be adjusted in various ways to fit the second groove 201 or to overflow from the second groove 201.

The second micro semiconductor chip M2 may be sprayed directly on the second substrate 20 without the liquid L or may be supplied while being included in a suspension. A method of supplying the second micro semiconductor chip M2 included in the suspension may use in various ways, for example, a spray method, a dispensing method of dropping the liquid L in a drop, an inkjet dot method of discharging the liquid L like a printing method, a method of flowing the suspension onto the second substrate 20, etc.

Next, each of the plurality of second micro semiconductor chips M2 may be inserted into the second groove 201 by the chip alignment member 120. As an example in this regard, the chip alignment member 120 may include the absorption member 121 that may absorb the liquid L. The absorption member 121 may be moved to scan the second substrate 20. The absorption member 121 may be a material capable of absorbing the liquid L, and its shape or structure is not limited. The absorption member 121 may include, for example, fabrics, tissues, polyester fibers, paper or wipers, etc. The absorption member 121 may be used alone without any other auxiliary instrument, but is not limited thereto, and may be coupled to the support 122 in order to conveniently scan the second substrate 20. The support 122 may have various forms and structures suitable for scanning the first substrate 10. The support 122 may have a form, for example, such as a rod, a blade, a plate, or a wiper. The absorption member 121 may be provided on a side of the support 122, or may surround the circumference of the support 122.

The absorption member may scan the second substrate 20 while pressing the second substrate 20 with appropriate pressure. Scanning may include absorbing the liquid L as the absorption member 121 contacts the second substrate 20 and passes through or along the plurality of second grooves 201. Scanning may be performed in various ways in, for example, a sliding method of the absorption member 121, a rotating method, a translating motion method, a reciprocating motion method, a rolling method, a spinning method, and/or a rubbing method, and may include both a regular method and an irregular method. Instead of moving the absorption member 121, scanning may be performed by moving the second substrate 20, and scanning of the second substrate 20 may also be performed in the sliding method, the rotating method, the translating motion method, the reciprocating motion method, the rolling method, the spinning method, and/or the rubbing method. Scanning may also be performed in cooperation with the absorption member 121 and the second substrate 20.

In this way, the plurality of second micro semiconductor chip M2 may be respectively disposed in the plurality of second grooves 201 of the second substrate 20, by supplying the plurality of second micro semiconductor chip M2 together with the liquid L to the second substrate 20, and applying external force to the plurality of second micro semiconductor chip M2 through the absorption member 121, etc. The plurality of second micro semiconductor chip M2 may be respectively disposed in the plurality of second grooves 201 of the second substrate 20, by removing the liquid L.

Referring to FIGS. 8 and 9, the second micro semiconductor chip M2 may be inserted into the second groove 201 in a specific direction during a process of absorbing the liquid L. Because the transfer method of the second micro semiconductor chip M2 proceeds in the same manner as the transfer method of the first micro semiconductor chip M1, a direction in which the second micro semiconductor chip M2 is assembled in the second groove 201 may be the same as a direction in which the first micro semiconductor chip M1 is assembled in the first groove 101. For example, when the first micro semiconductor chip M1 includes an upper surface and a lower surface having different interfacial energy, and the second micro semiconductor chip M2 includes an upper surface and a lower surface having different interfacial energy, the first micro semiconductor chip M1 assembled in the first groove 101 may be disposed so that the upper surface faces upward, and the second micro semiconductor chip M2 inserted into the empty first groove 101A may be disposed so that the upper surface of the second micro semiconductor chip M2 faces in the same direction as the upper surface of the first micro semiconductor chip M1. For example, when the first micro semiconductor chip M1 is inserted into the first groove 101 so that the first electrode layer M11 faces upward, the second micro semiconductor chip M2 may be inserted into the second groove 201 so that the second electrode layer M21 faces upward. However, the arrangement of the first micro semiconductor chip M1 and the second micro semiconductor chip M2 is not limited thereto, and may vary depending on the structure of each of the first micro semiconductor chip M1 and the second micro semiconductor chip M2. For example, when each of the first micro semiconductor chip M1 and the second micro semiconductor chip M2 has a vertical electrode structure, the first micro semiconductor chip M1 and the second micro semiconductor chip M2 may be respectively disposed in the first groove 101 and the second groove 201 so that an upper electrode faces upward and a lower electrode faces downward.

Because the second micro semiconductor chips M2 may be used to complement the mass-transfer of the plurality of first micro semiconductor chips M1 onto the first substrate 10, the number of the second micro semiconductor chips M2 transferred onto the second substrate 20 may be smaller than the number of the first micro semiconductor chips M1 transferred onto the first substrate 10. However, the number of the second micro semiconductor chips M2 transferred onto the second substrate 20 is not limited thereto, and may be the same as or more than the number of the first micro semiconductor chips M1 transferred onto the first substrate 10 as necessary.

In the second substrate 20 on which the second transfer operation S21 is performed, the second micro semiconductor chip M2 may be inserted into at least one second groove 201, and the second micro semiconductor chip M2 may not be inserted into some second grooves 201A.

The vision detection module 300 may be located on the second substrate 20 and may detect the second micro semiconductor chip M2 transferred onto the second substrate 20. For example, the vision detection module 300 may optically capture images of, or data about, the second substrate 20 wholly or partially. Thus, second information about the second micro semiconductor chips M2 transferred onto the plurality of second grooves 201 of the second substrate 20 may be detected by the vision detection module 300. The second information may include at least one of information about the second groove 201 in which the second micro semiconductor chip M2 is disposed or information about the second groove 201A in which the second micro semiconductor chip M2 is not disposed.

Figure 6B:
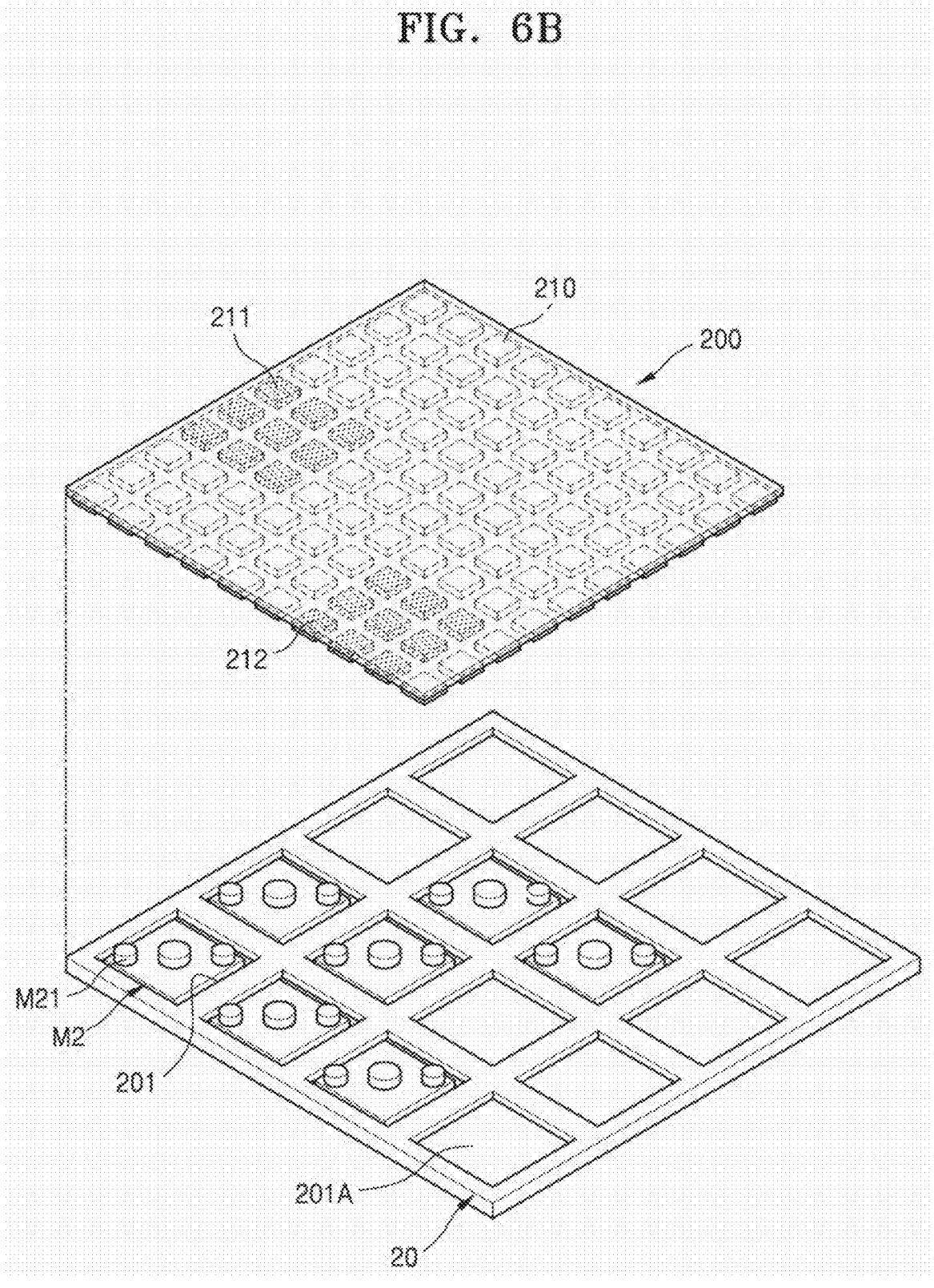
Figure 6C:
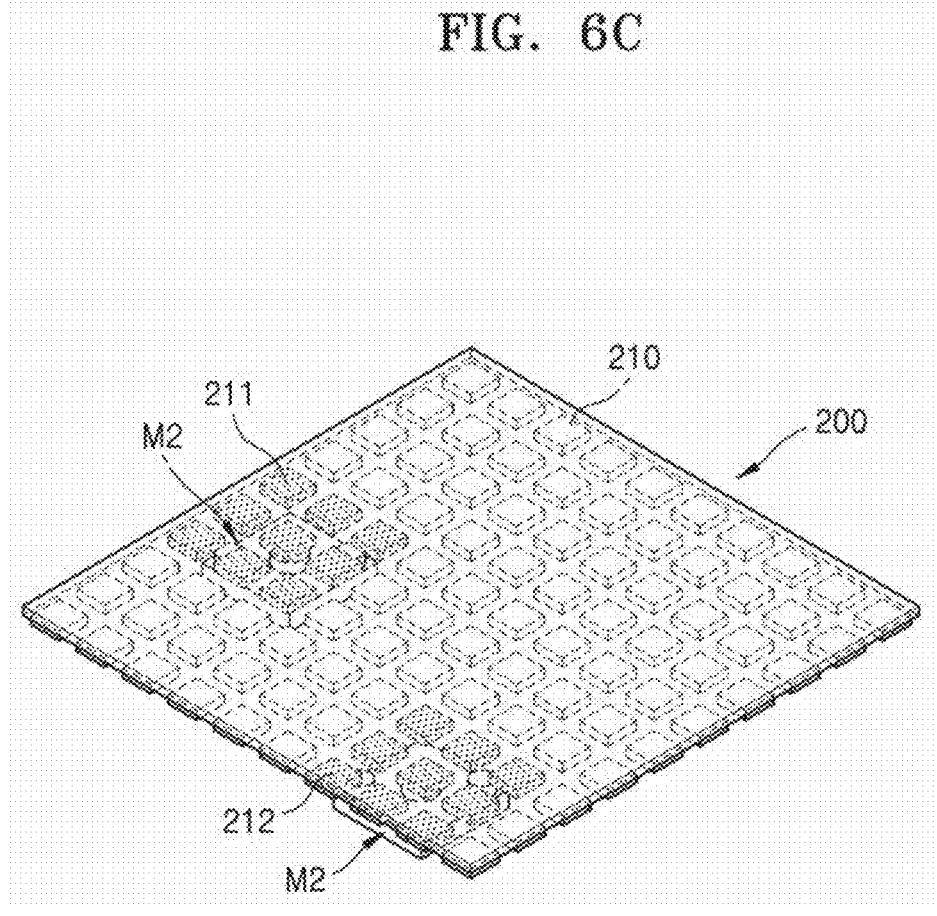
Figure 6D:
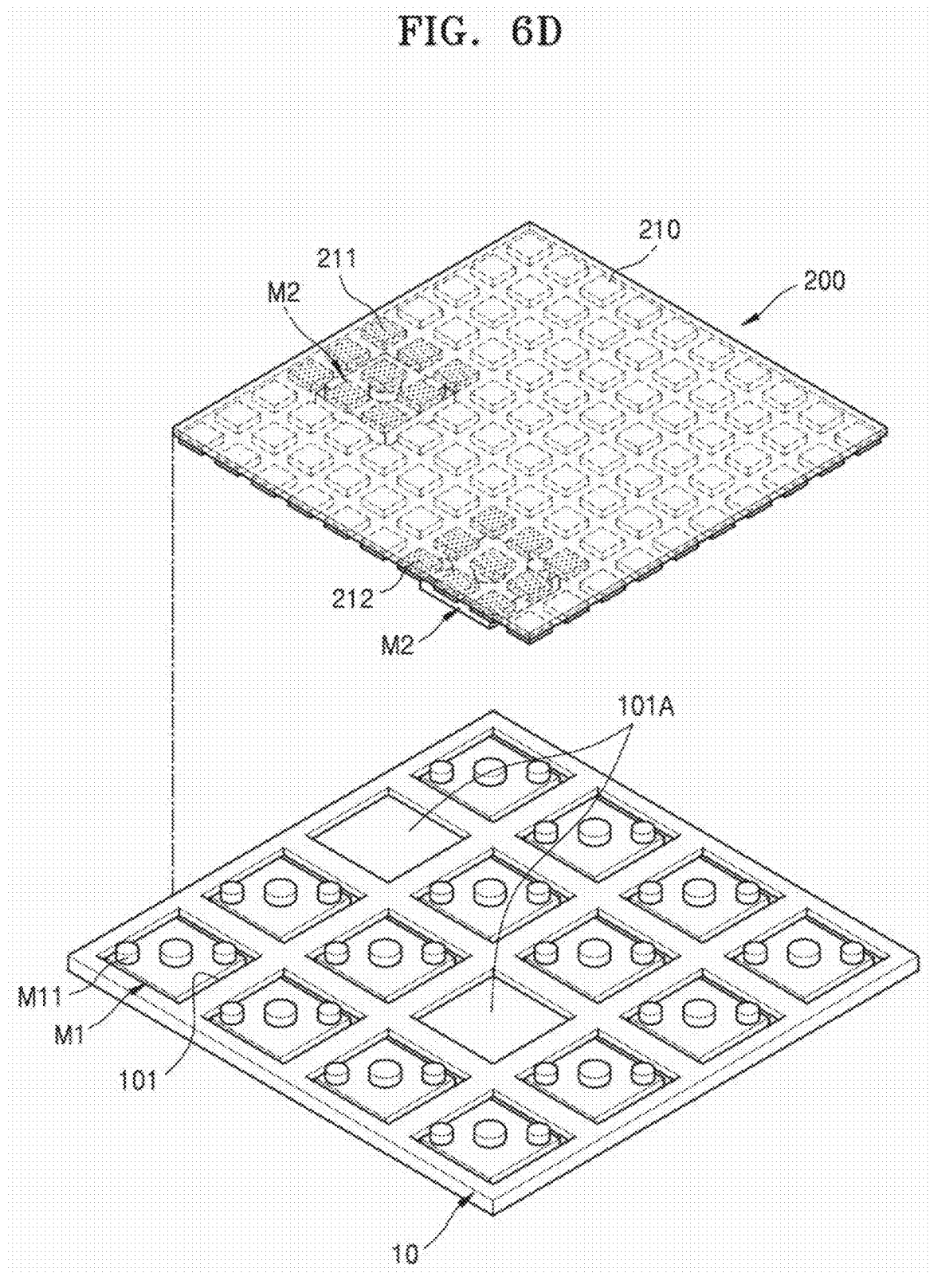
Figures 7, 8:
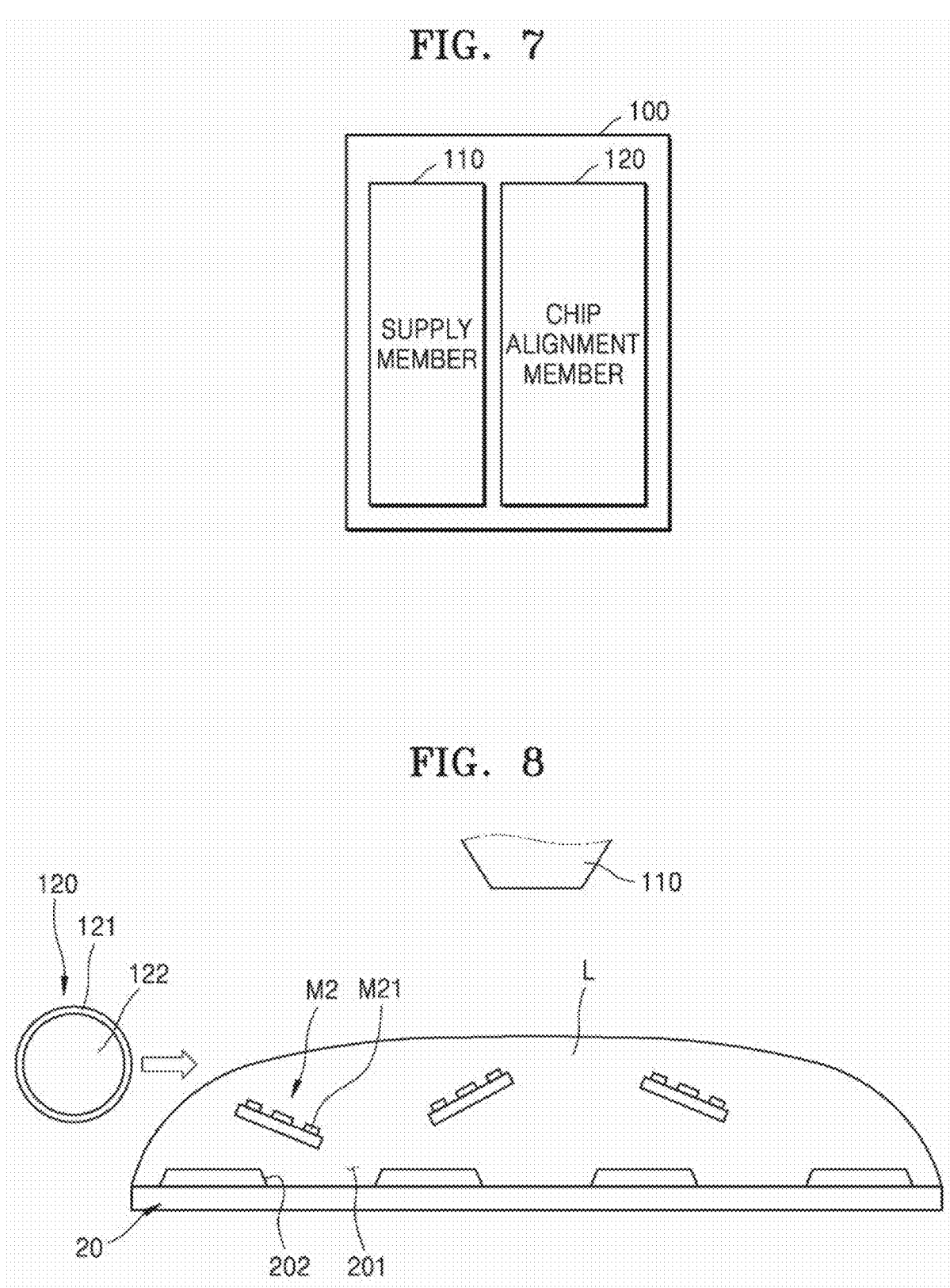
FIG. 7 is a block diagram schematically showing a transfer module used in FIG. 6A according to an embodiment.
FIG. 8 is a cross-sectional view illustrating a process of transferring a second micro semiconductor chip onto a second substrate by the transfer module of FIG. 7 according to an embodiment.

Referring to FIGS. 6B to 6D, operation S20 of complementing the empty first groove 101A according to an embodiment may include operation S22 of assembling the second micro semiconductor chip M2 in the empty first groove 101A using an electrostatic or electromagnetic force. To this end, the device for complementing the mass-transfer of micro semiconductor chips may include the array module 200 which may selectively generate the electrostatic or electromagnetic force in a specific region among a plurality of regions.

In FIG. 6B, the array module 200 is illustrated as being disposed relatively far away from the second substrate 20 for description of the array module 200, but in a process of operating the array module 200, the array module 200 may be disposed close enough to the second substrate 20 to adsorb the second micro semiconductor chip M2 using electrostatic or electromagnetic force.

Figure 10:
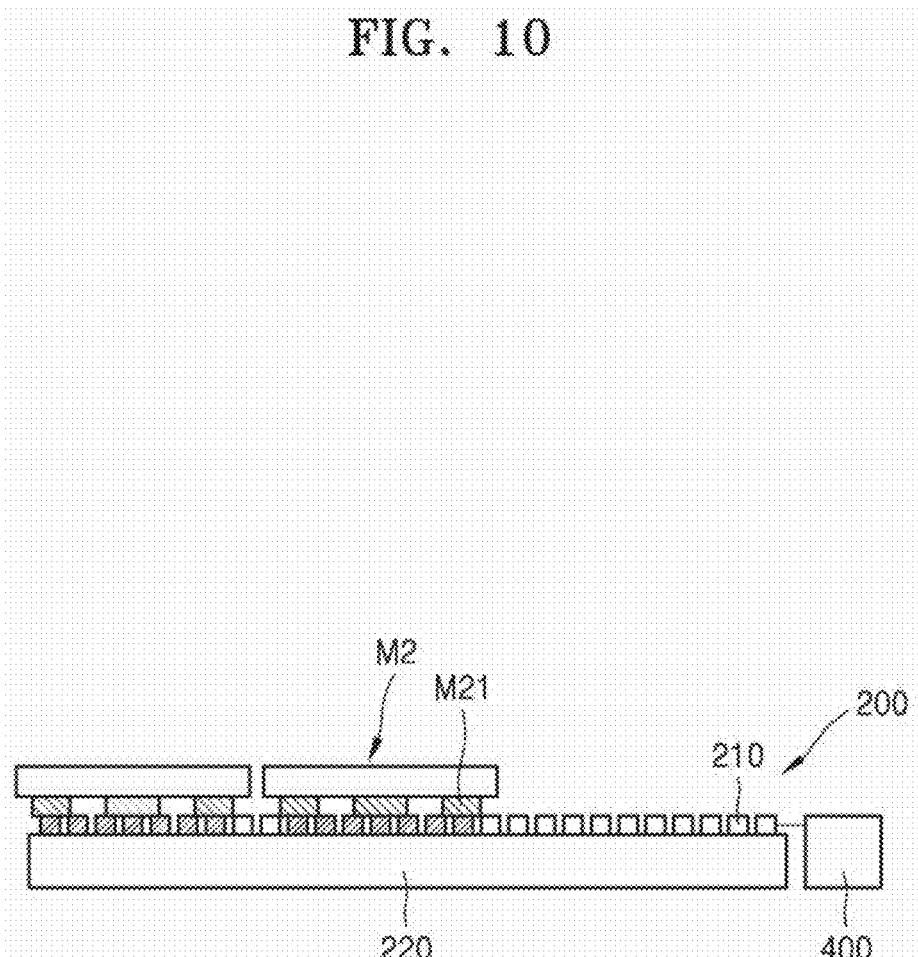
FIG. 10 is a cross-sectional view illustrating an array module used in FIGS. 6B to 6D according to an embodiment.

FIG. 10 is a cross-sectional view illustrating an array module 200 used in FIGS. 6B to 6D, and FIG. 11 is a top view of the array module 200 of FIG. 10, according to embodiments.

Figure 11:
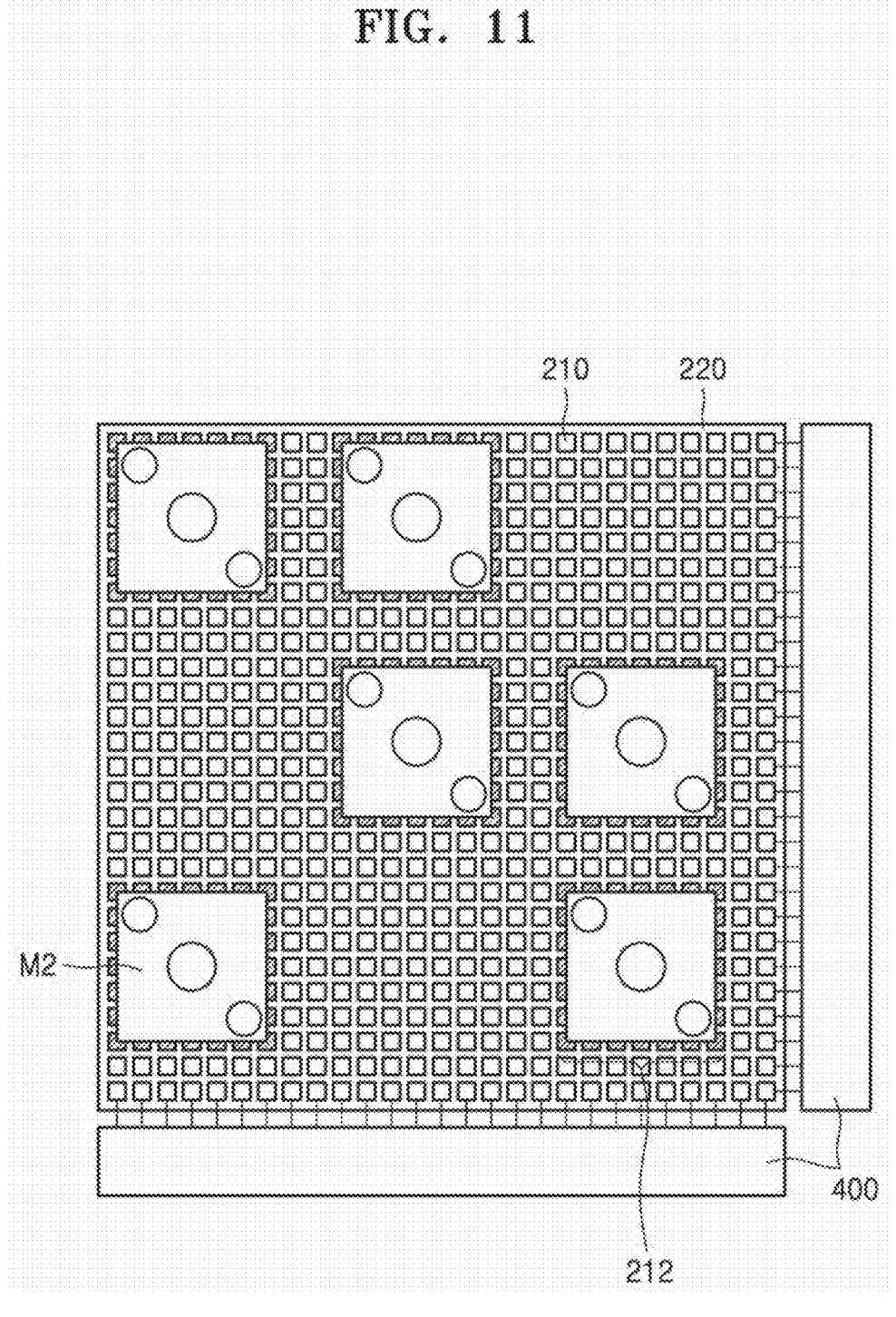
FIG. 11 is a top view of the array module of FIG. 10 according to an embodiment.

Referring to FIGS. 10 and 11, the array module 200 may include a plurality of unit cells 210 arranged in two dimensions. The unit cell 210 may be a metal electrode. For example, the plurality of unit cells 210 may be arranged to have a plurality of rows and plurality of columns. Each of the plurality of unit cells 210 may be smaller than the size of the second micro semiconductor chip M2. For example, the size of the unit cell 210 may be equal to or smaller than ½, ⅓, or ⅕ of the size of the second micro semiconductor chip M2. For example, the length of the unit cell 210 may be equal to or smaller than ½, ⅓, or ⅕ of the length of the second micro semiconductor chip M2.

The array module 200 may include an insulating substrate 220 in which the plurality of unit cells 210 are disposed and a controller 400 controlling operations of the plurality of unit cells 210. First and second conductive lines extending from the controller 400 may be disposed in the insulating substrate 220. The first conductive lines and the second conductive lines may be arranged to cross each other. The controller 400 may use a thin film transistor connected to the plurality of unit cells 210 to selectively turn on or activate the plurality of unit cells 210 in a similar manner to the pixel control of a display. For example, a gate electrode of the thin film transistor may be connected to a first conductive line, a source electrode of the thin film transistor may be connected to a second conductive line, and a drain electrode of the thin film transistor may be connected to the unit cell 210. The controller 400 may selectively turn on or activate the plurality of unit cells 210 by selectively applying power to the first and second conductive lines.

As the unit cell 210 is activated, an electrostatic or magnetic field may be formed in the unit cell 210, and an electrostatic or electromagnetic force may be generated between the unit cell 210 and the second micro semiconductor chip M2. The unit cell 210 may form the electrostatic or magnetic field using any structure or method as desired. The controller 400 may be connected to the transfer module 100 and the vision detection module 300, and may control operations of the transfer module 100 and the vision detection module 300.

The array module 200 may wholly or partially generate the electrostatic or electromagnetic force, by wholly or partially turning on the plurality of unit cells 210. The array module 200 may adsorb a micro semiconductor chip of a desired position, by selectively turning on the unit cell 210 of a specific region or some regions.

Referring again to FIG. 6B, the array module 200 may selectively activate a unit cell 210 at a certain position. The array module 200 may activate some of the plurality of unit cells 210, based on the first information about the empty first groove 101A of the first substrate 10 and the second information about the plurality of second micro semiconductor chips M2 transferred onto the plurality of second grooves 201 of the second substrate 20.

For example, the array module 200 may selectively activate the unit cells 210 corresponding to a region in which the position of the empty first groove 101A in the first substrate 10 overlaps the position of the second groove 201 that is not empty in the second substrate 20, based on the first information and the second information. For example, the array module 200 may supply power to a first unit cell region 211 and a second unit cell region 212 determined considering the position of the empty first groove 101A of the first substrate 10 and the position of the second groove 201 that is not empty in the second substrate 20, and may not supply power to other regions.

Referring to FIG. 6C, the array module 200 may adsorb some of the plurality of second micro semiconductor chips M2 transferred onto the second substrate 20 in a specific region by an electrostatic or electromagnetic force. The array module 200 may selectively adsorb some of the second micro semiconductor chips M2 by the electrostatic or electromagnetic force generated in the first unit cell region 211 and second unit cell region 212. One second micro semiconductor chip M2 may be adsorbed to the first unit cell region 211, and the other second micro semiconductor chip M2 may be adsorbed to the second unit cell region 212. The second micro semiconductor chip M2 may be adsorbed with the second electrode layer M21 facing the array module 200.

Referring to FIG. 6D, the array module 200 and the first substrate 10 may be aligned. For example, the position of the array module 200 may be aligned so that the second micro semiconductor chip M2 adsorbed to the array module 200 corresponds to the empty first groove 101A of the first substrate 10. The position alignment of the array module 200 may proceed by positioning of the array module 200, positioning of the first substrate 10, or positioning of both the array module 200 and the first substrate 10.

Based on the position of the array module 200 being aligned, generation of the electrostatic or electromagnetic force of the array module 200 may be stopped, by blocking the power applied to the unit cell 210 of the array module 200. Accordingly, the second micro semiconductor chip M2 adsorbed by the electrostatic or electromagnetic force may be separated from the array module 200. The second micro semiconductor chip M2 separated from the array module 200 may be inserted into the empty first groove 101A of the first substrate 10. In embodiments, the empty first groove 101A may be referred to as a first groove 101 after it is filled by the second micro semiconductor chip M2, and is therefore no longer empty. The separated second micro semiconductor chip M2 may be inserted into the first groove 101 of the first substrate 10, with the second electrode layer M21 facing upward.

Figure 6E:
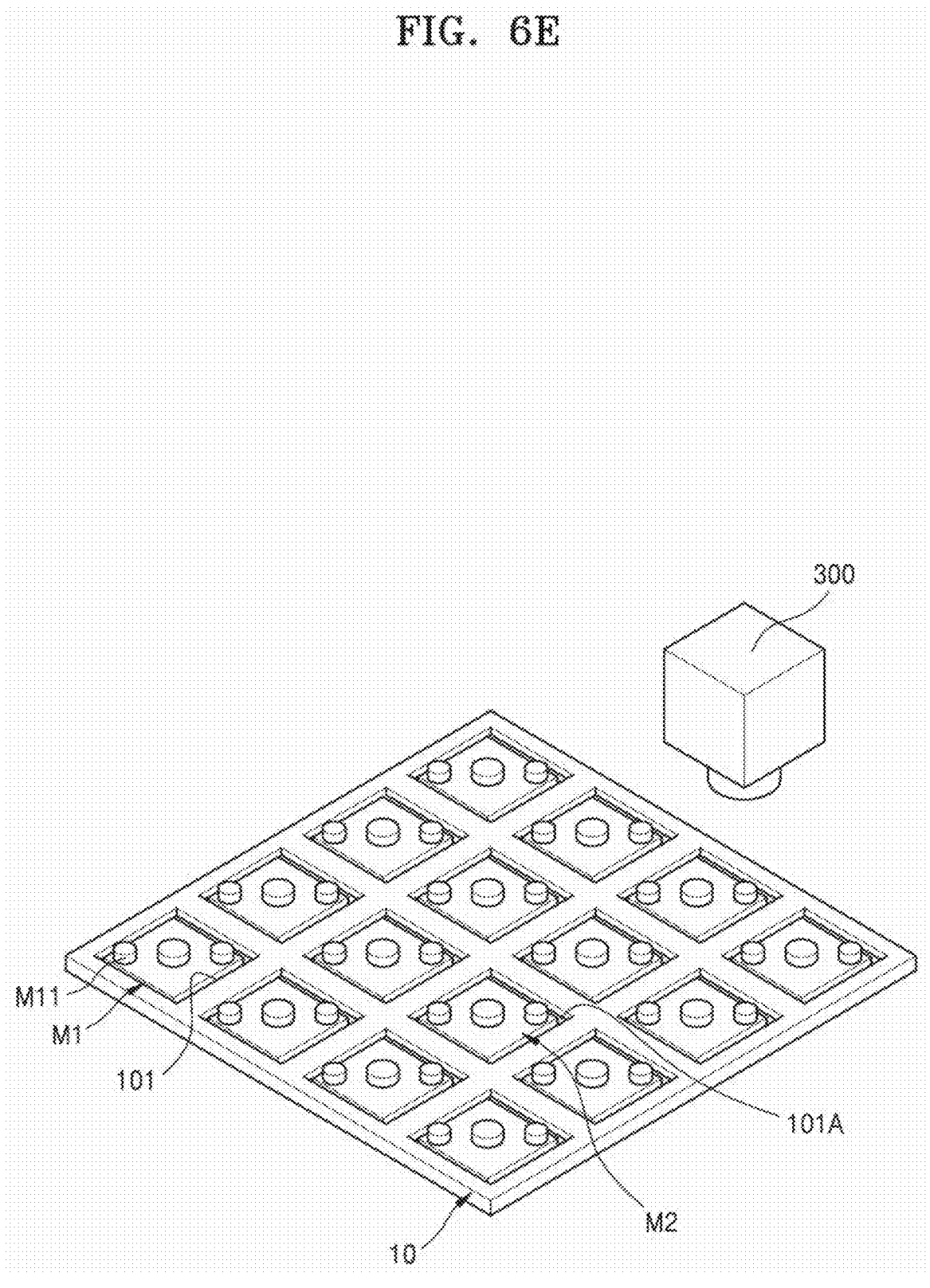

Referring to FIG. 6E, the first substrate 10 to which the second micro semiconductor chip M2 is selectively transferred by the array module 200 may be in a state in which the first micro semiconductor chip M1 or the second micro semiconductor chip M2 is inserted into each of the plurality of first grooves 101. The first micro semiconductor chip M1 or the second micro semiconductor chip M2 may be assembled in each of the first grooves 101 in a constant direction, for example, in a direction in which the first and second electrode layers M11 and M21 face upward. In embodiments, when each of the first micro semiconductor chip M1 and the second micro semiconductor chip M2 has a vertical electrode structure, the first micro semiconductor chip M1 and the second micro semiconductor chip M2 may be respectively disposed in the first grooves 101 and 101A so that the upper electrode faces upward and the lower electrode faces downward.

The vision detection module 300 may optically measure a transfer state of the first substrate 10. The vision detection module 300 may measure states where the first and second micro semiconductor chips M1 and M2 are transferred to the first grooves 101 of the first substrate 10. The controller 400 may determine whether to end operation S20 of complementing the mass-transfer based on the information measured by the vision detection module 300.

If it is determined from the information measured by the vision detection module 300 that the empty first groove 101A of the first substrate 10 is within a reference range, the controller 400 may end operation S20 of complementing the empty first groove 101A. For example, when it is determined that a ratio of the empty first grooves 101A among the total number of the first grooves 101 of the first substrate 10 is equal to or less than 0.1%, the controller 400 may end operation S20 of complementing the empty first groove 101A. If it is determined from the information measured by the vision detection module 300 that the empty first groove 101A of the first substrate 10 does not satisfy the reference range, the controller 400 may perform operation S20 again. For example, at least some operations of the process illustrated in FIGS. 6A to 6D may be performed again.

At a time at which the operation S20 ends, the first substrate 10 may be in a state in which the first micro semiconductor chip M1 or the second micro semiconductor chip M2 is inserted into more than 99.9% of the plurality of first grooves 101.

Referring again to FIG. 1, the mass-transfer method of the plurality of micro semiconductor chips according to an embodiment may further include operation S30 of transferring the plurality of first and second micro semiconductor chips M1 and M2 transferred onto the first substrate 10 onto a driving substrate (for example the driving substrate 12 of FIG. 18) after operation S20 of complementing the empty first groove 101A.

The plurality of first and second micro semiconductor chips M1 and M2 transferred onto the first substrate 10 may be transferred onto another substrate, for example, on the driving substrate 12. The first and second micro semiconductor chips M1 and M2 transferred onto the driving substrate 12 may be electrically connected to the driving substrate 12. The driving substrate 12 may include a thin film transistor which may be electrically connected to the first and second micro semiconductor chips M1 and M2.

However, third transfer operation S30 may be omitted according to the type of the first substrate 10. For example, if the first substrate 10 is a driving substrate rather than a transfer substrate, that is, when first transfer operation S10 is directly performed on the driving substrate 12, third transfer operation S30 may be omitted.

Figures 13A, 13B:
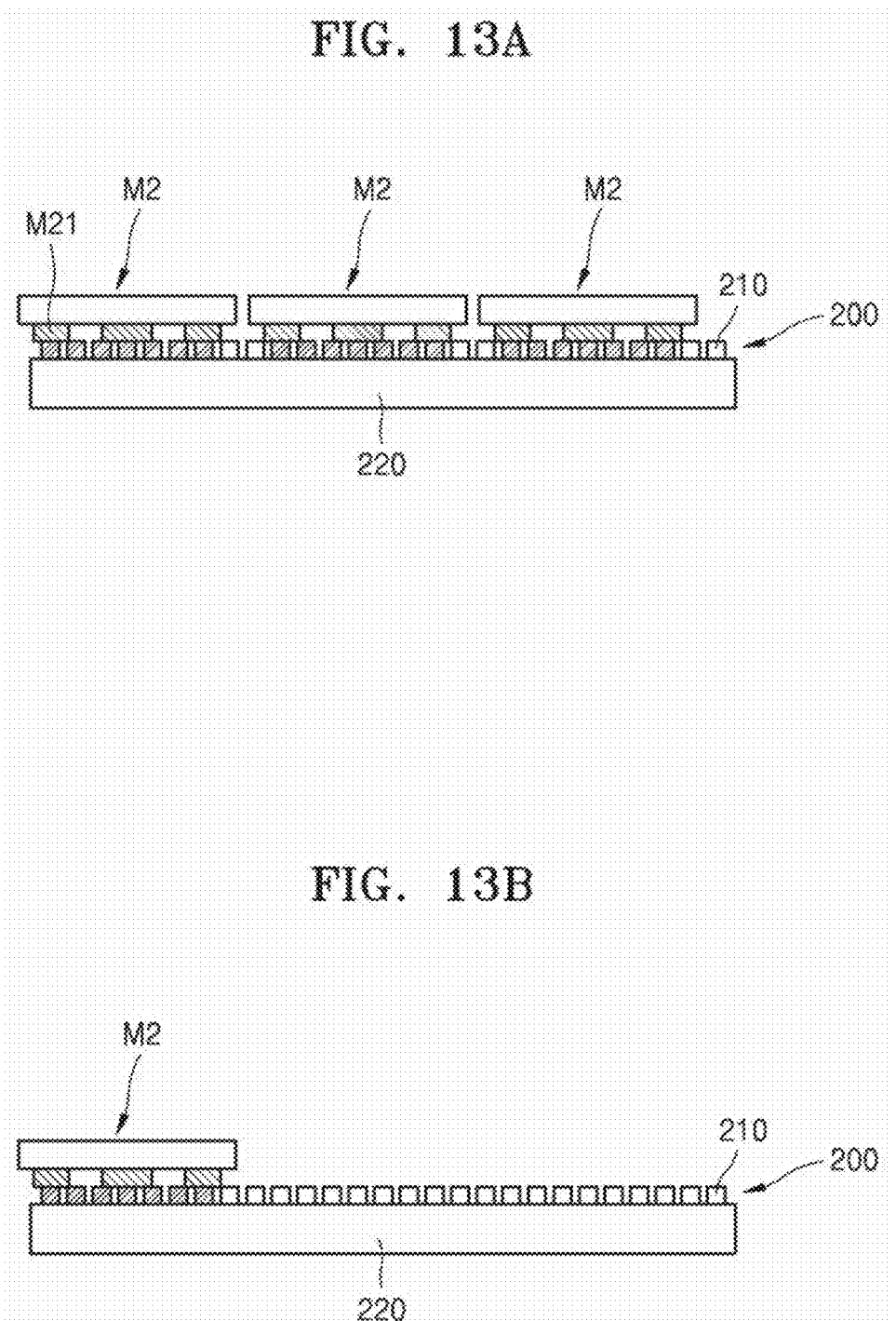
FIG. 13A is a cross-sectional view of a part of FIG. 12C taken along line AA, according to an embodiment.
FIG. 13B is a cross-sectional view of a part of FIG. 12D taken along line BB according to an embodiment.
Figure 14:
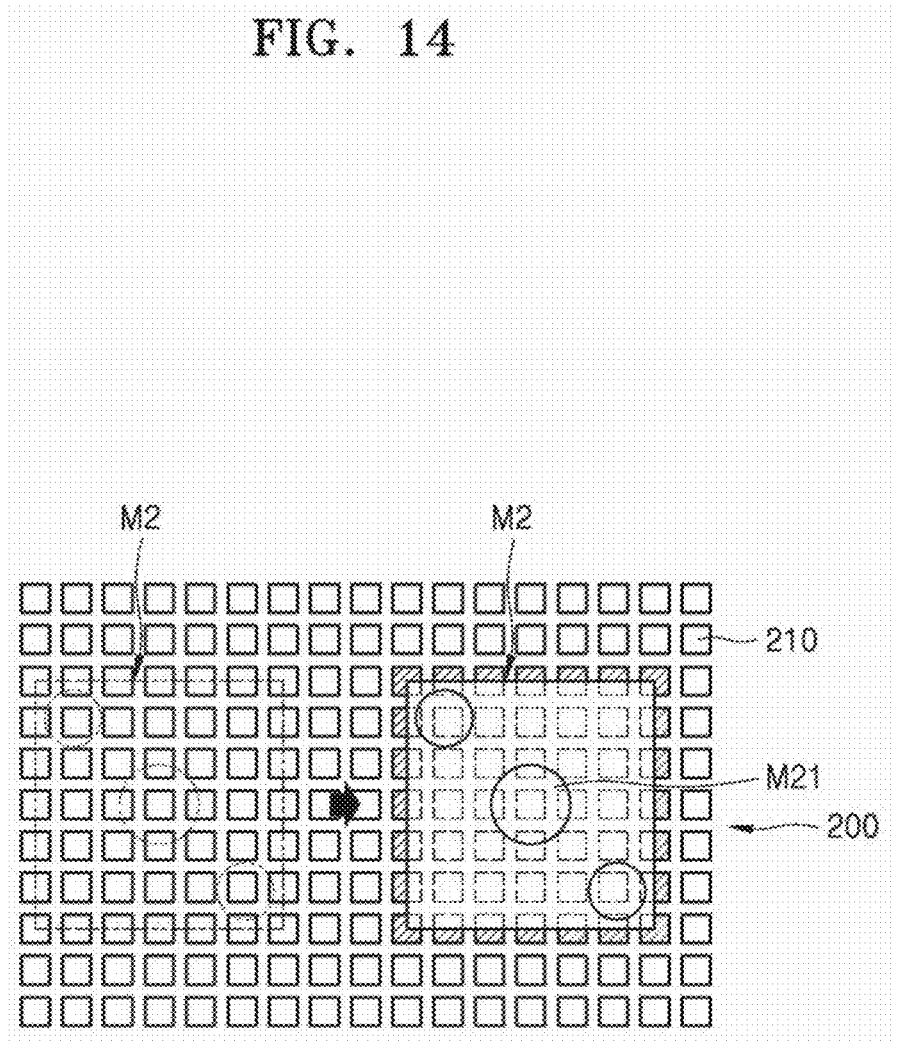
FIG. 14 is a view illustrating a movement of a second micro semiconductor chip in an array module according to an embodiment.

FIGS. 12A to 12F are diagrams illustrating operation S20 of complementing the empty first groove 101A according to another embodiment. FIG. 13A is a cross-sectional view of a part of FIG. 12C taken along line AA, and FIG. 13B is a cross-sectional view of a part of FIG. 12D taken along line BB. FIG. 14 is a view illustrating movement of the second micro semiconductor chip M2 in the array module 200.

Figure 12A:
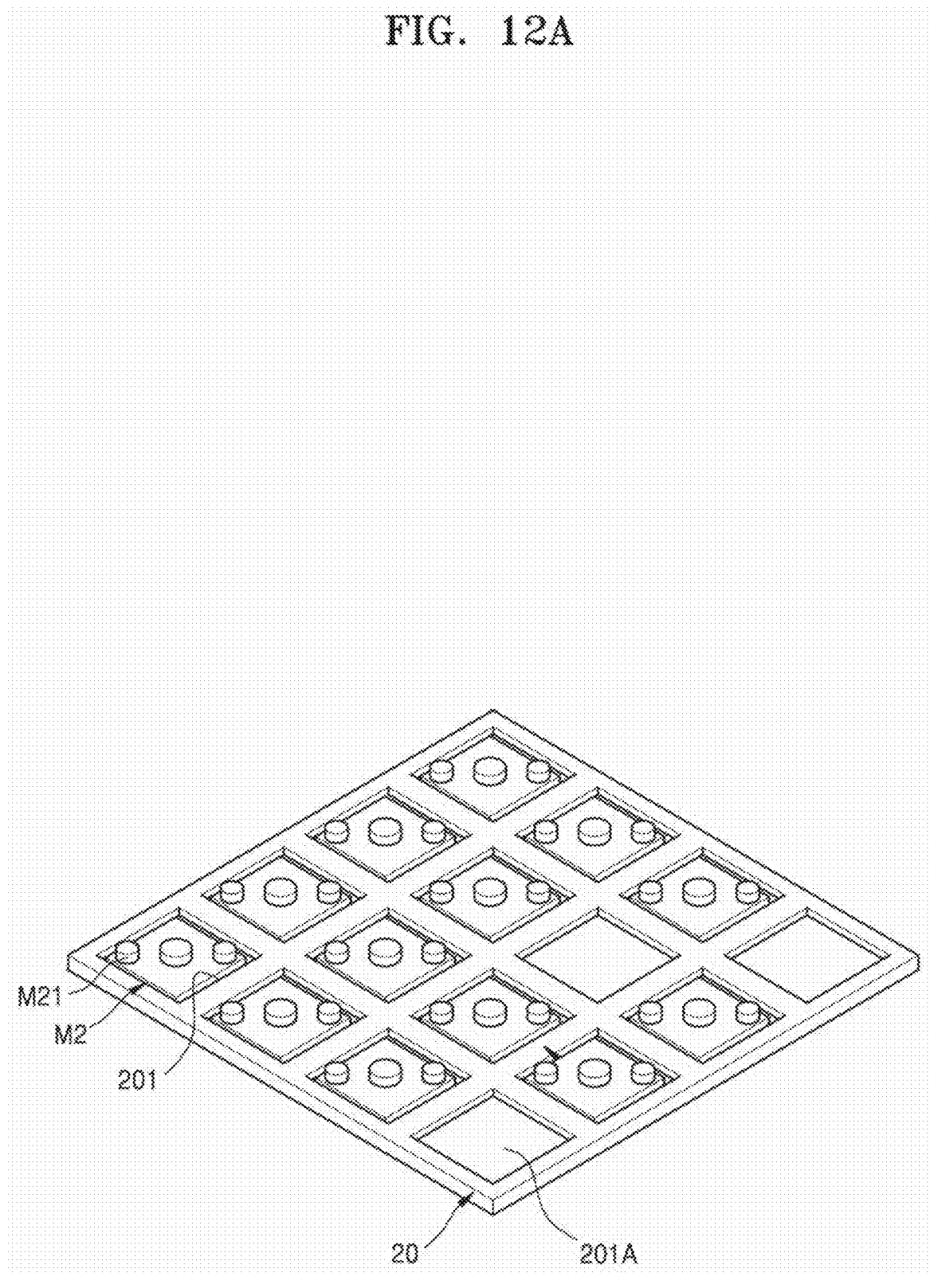
FIGS. 12A to 12F are diagrams illustrating a complementing operation according to an embodiment.

Referring to FIG. 12A, at operation S20 of complementing the empty first groove 101A according to an embodiment, the second micro semiconductor chip M2 may be transferred onto the second substrate 20 in the same manner as the transfer method of the first substrate 10, for example at operation S21. The transfer method of the second micro semiconductor chip M2 onto the second substrate 20 and the transfer module 100 used therein are substantially the same as those given with reference to FIGS. 6A and 7 to 9, and thus, redundant descriptions thereof are omitted.

Figure 12B:
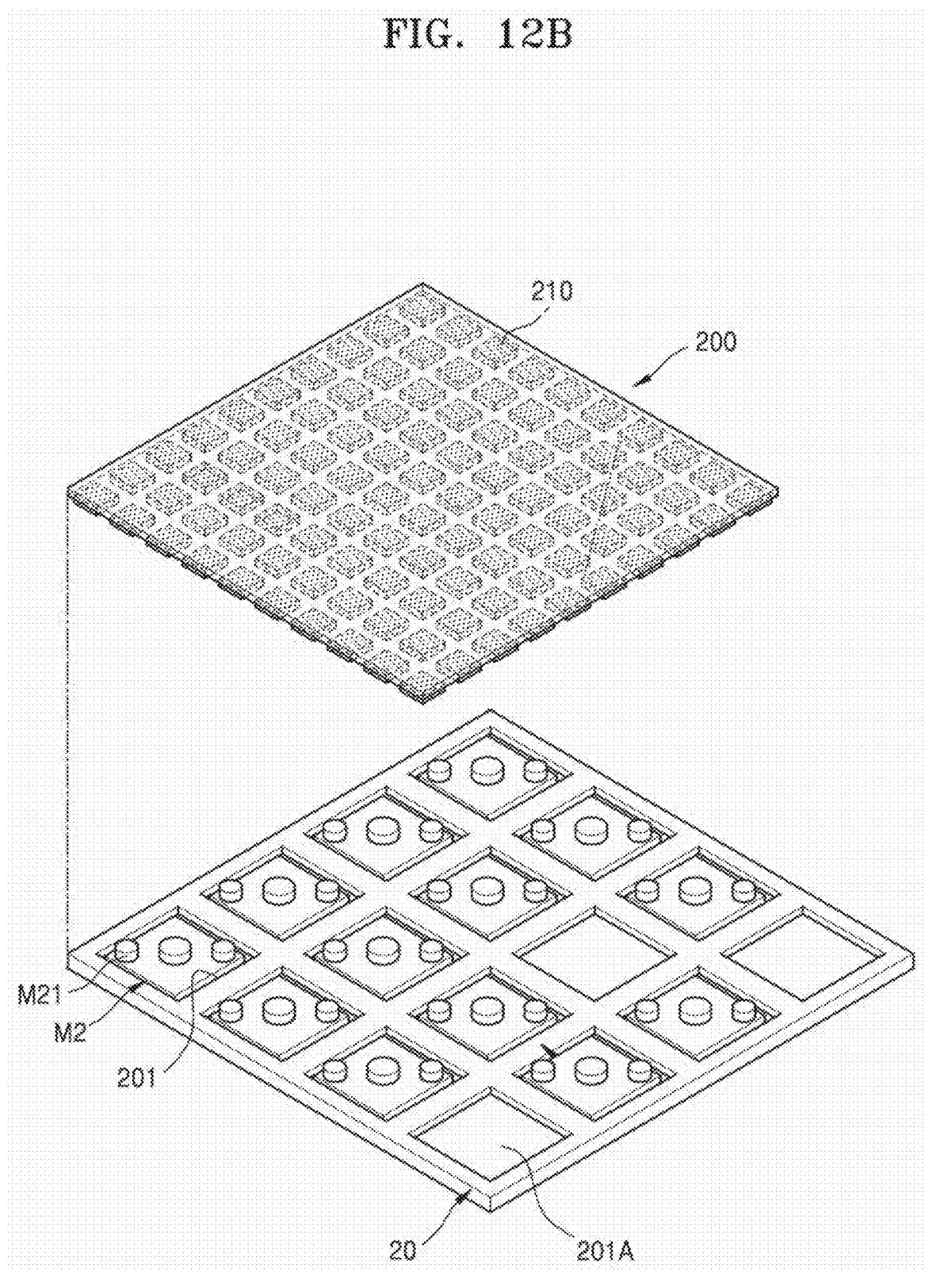

Referring to FIG. 12B, the array module 200 may activate the unit cell 210 disposed to face downward in the entire region. Accordingly, the plurality of second micro semiconductor chips M2 disposed in a region overlapping the array module 200 in the second substrate 20 may be adsorbed to the array module 200 by an electrostatic or electromagnetic force.

Figure 12C:
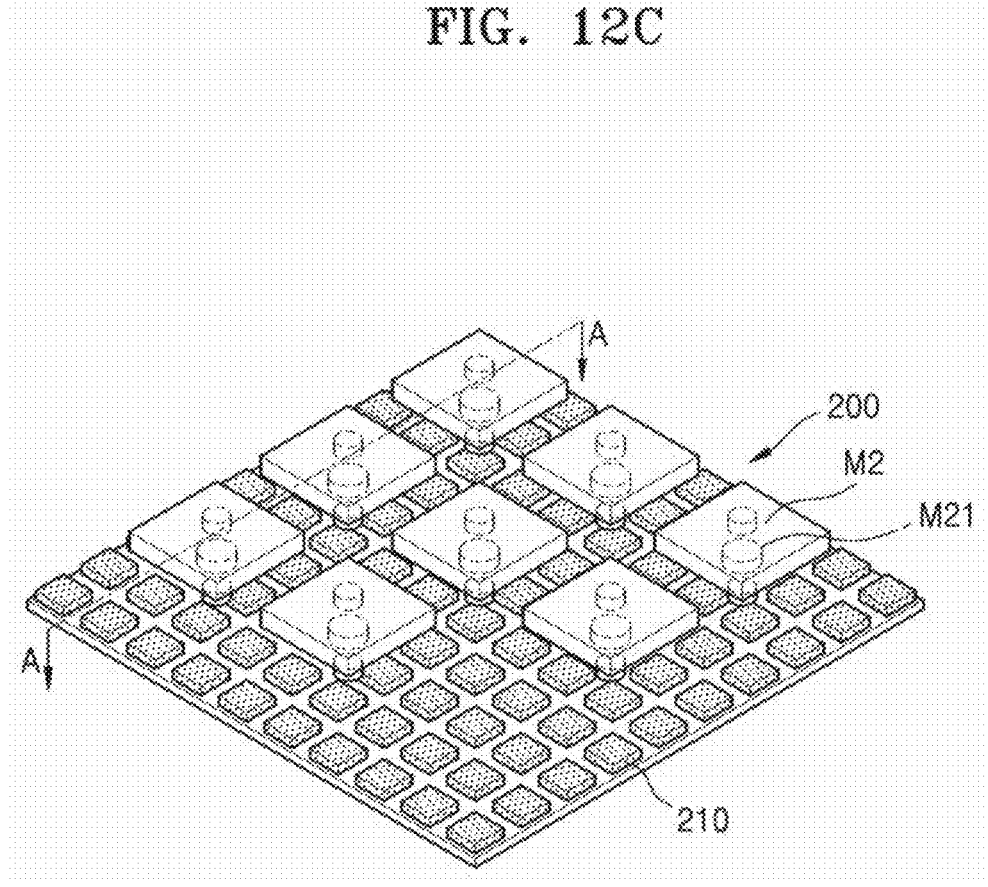

Referring to FIGS. 12C and 13A, the array module 200 may be turned upside down or inverted so that the unit cell 210 faces upward. The plurality of second micro semiconductor chips M2 may be disposed in the upside down array module 200 so that the second electrode layer M21 faces downward. The plurality of second micro semiconductor chips M2 may be supported by the unit cell 210 by a load and the electrostatic or electromagnetic force.

Figure 12D:
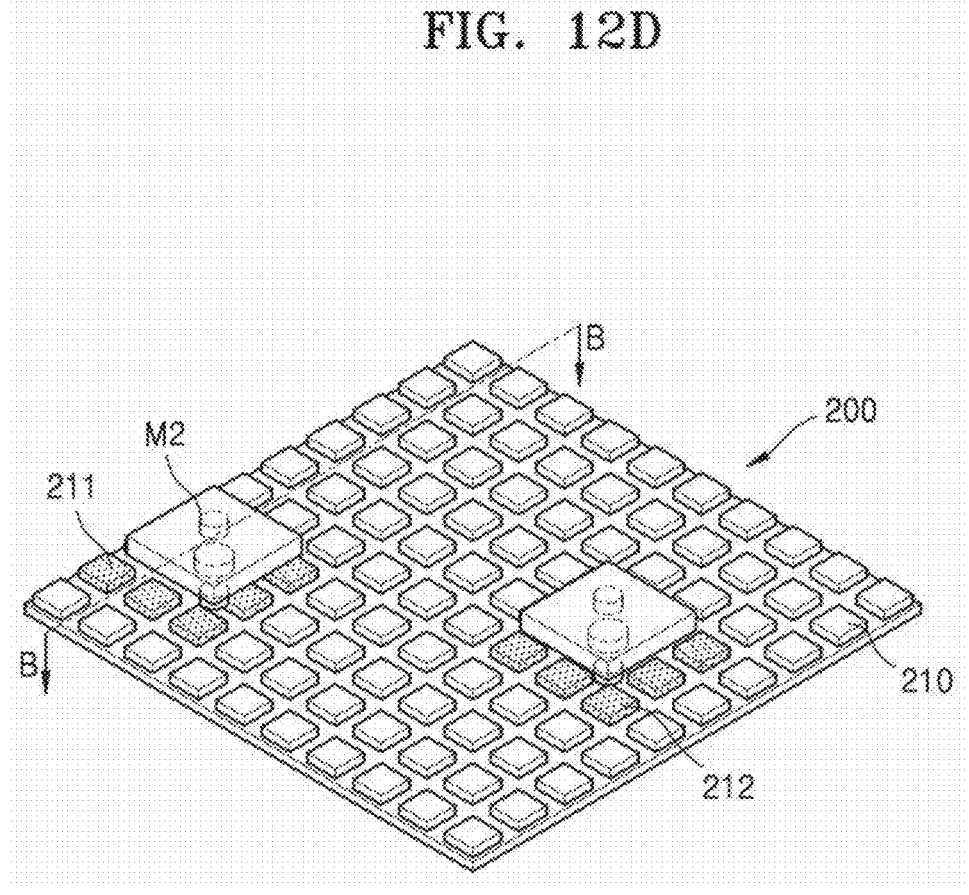

Referring to FIGS. 12D and 13B, the array module 200 may adsorb and support some of the second micro semiconductor chips M2 of a desired position. Based on first information about the empty first groove 101A of the first substrate 10, the array module 200 may selectively apply power to some unit cells 210. For example, the array module 200 may apply power to the unit cell 210 of a region corresponding to the position of the empty first groove 101A of the first substrate 10, and may not apply power to the remaining unit cells 210. As shown in FIG. 14, the positon of the second micro semiconductor chip M2 on the array module 200 may be moved by the electrostatic or electromagnetic force. Thus, the second micro semiconductor chip M2 may be rearranged by the electrostatic force or electromagnetic force in the array module 200, and some second micro semiconductor chips M2 may be adsorbed to a certain position.

Figure 12E:
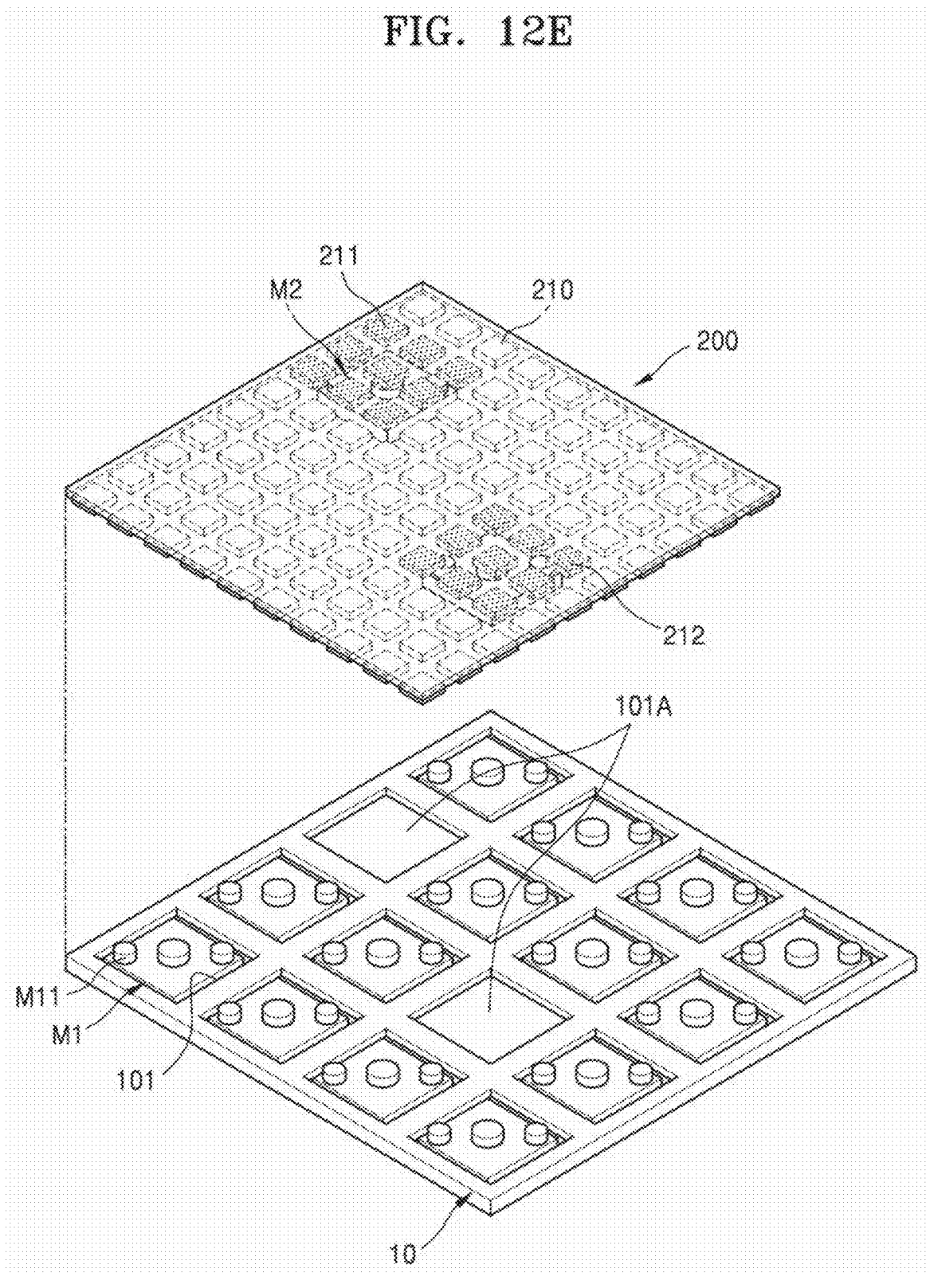

Referring to FIG. 12E, the array module 200 may be turned upside down or inverted so that the second electrode layer M21 faces upward, and the positions of the array module 200 and the first substrate 10 may be aligned so that the adsorbed second micro semiconductor chip M2 corresponds to the empty first groove 101A of the first substrate 10.

Based on the position of the array module 200 being aligned, the electrostatic or electromagnetic force of the array module 200 may be removed, by blocking the power applied to the unit cell 210 of the array module 200. Accordingly, the second micro semiconductor chip M2 adsorbed by the electrostatic or electromagnetic force may be separated from the array module 200. The second micro semiconductor chip M2 separated from the array module 200 may be inserted into the empty first groove 101A of the first substrate 10. The separated second micro semiconductor chip M2 may be assembled in the first groove 101 of the first substrate 10, with the second electrode layer M21 facing upward.

Figure 12F:
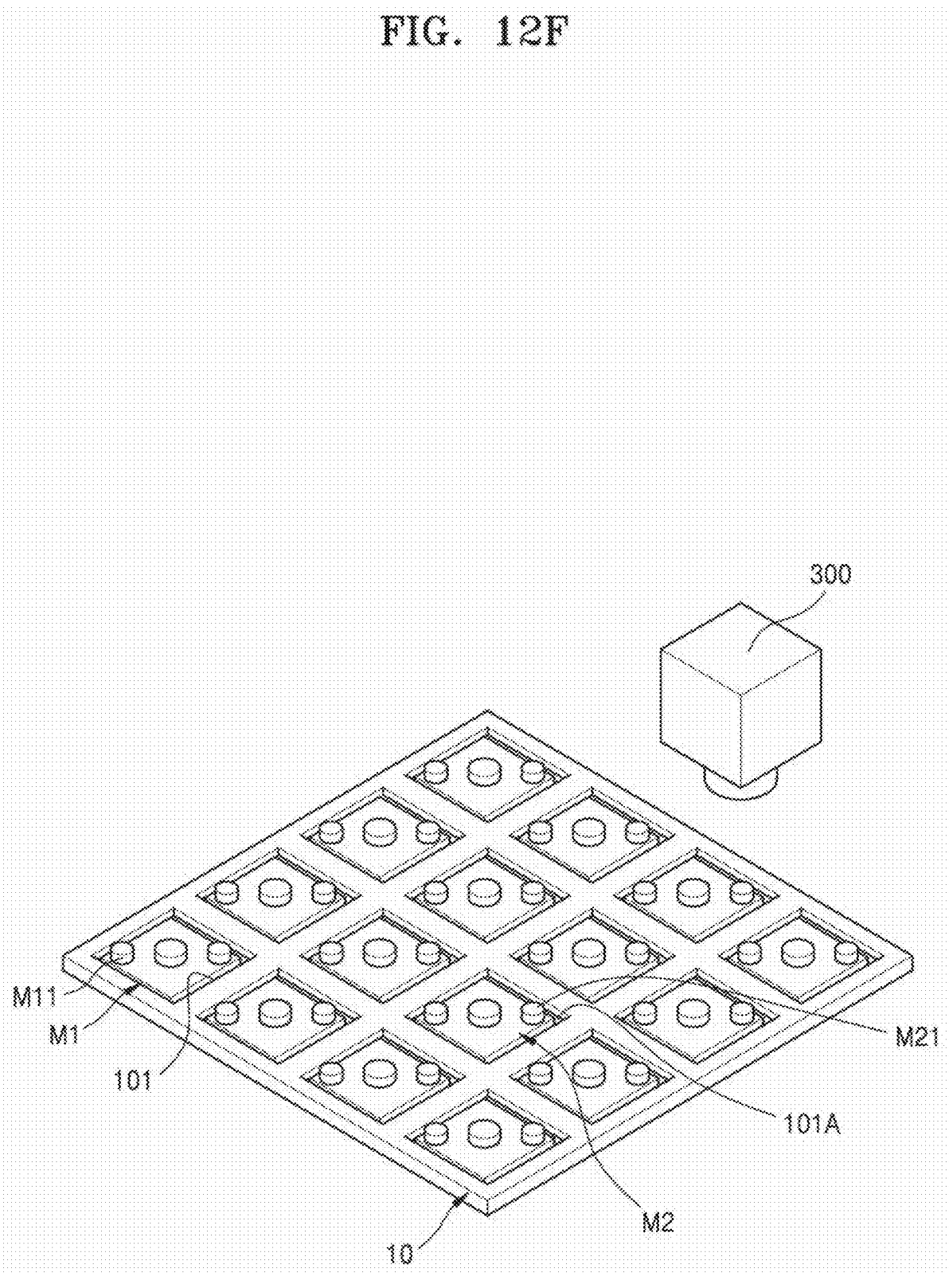

Referring to FIG. 12F, the first substrate 10 to which the second micro semiconductor chip M2 is complemented by the device for complementing the mass-transfer of micro semiconductor chips may be in the state where the first micro semiconductor chip M1 or the second micro semiconductor chip M2 may be assembled in each of the plurality of first grooves 101. The first and second micro semiconductor chips M1 and M2 are assembled in the same direction. For example, when the first micro semiconductor chip M1 assembled in the first groove 101 is disposed so that the first electrode layer M11 faces upward, the second micro semiconductor chip M2 assembled in the first groove 101 is also disposed so that the second electrode layer M21 faces upward.

The vision detection module 300 may optically measure the transfer state of the first substrate 10. The vision detection module 300 may measure states where the first and second micro semiconductor chips M1 and M2 are transferred to the first groove 101 of the first substrate 10. The controller 400 may determine whether to end operation S20 of complementing the mass-transfer based on the information measured by the vision detection module 300. Determining whether to end operation S20 of complementing the empty first groove 101A is the same as described above with reference to FIG. 6E, and thus, the redundant description thereof is omitted.

At a time at which the operation S20 ends, the first substrate 10 may be in a state in which the first and second micro semiconductor chips M1 and M2 are inserted into more than 99.9% of the plurality of first grooves 101.

In embodiments, the plurality of first and second micro semiconductor chips M1 and M2 transferred onto the first substrate 10 may be transferred onto another substrate, for example, on the driving substrate 12. The first and second micro semiconductor chips M1 and M2 transferred onto the driving substrate 12 may be electrically connected to the driving substrate 12.

In embodiments, as an operation of preparing the first substrate 10, an example of directly using the transfer substrate 11 onto which the first micro semiconductor chips M1 are mass-transferred has been described in the embodiments described above. However, the operation of preparing the first substrate 10 is not limited thereto, and the plurality of first micro semiconductor chips M1 transferred onto the transfer substrate 11 may be transferred onto another substrate, for example, the driving substrate 12.

FIGS. 15A to 15H are diagrams illustrating a mass-transfer method according to another embodiment.

Figure 15A:
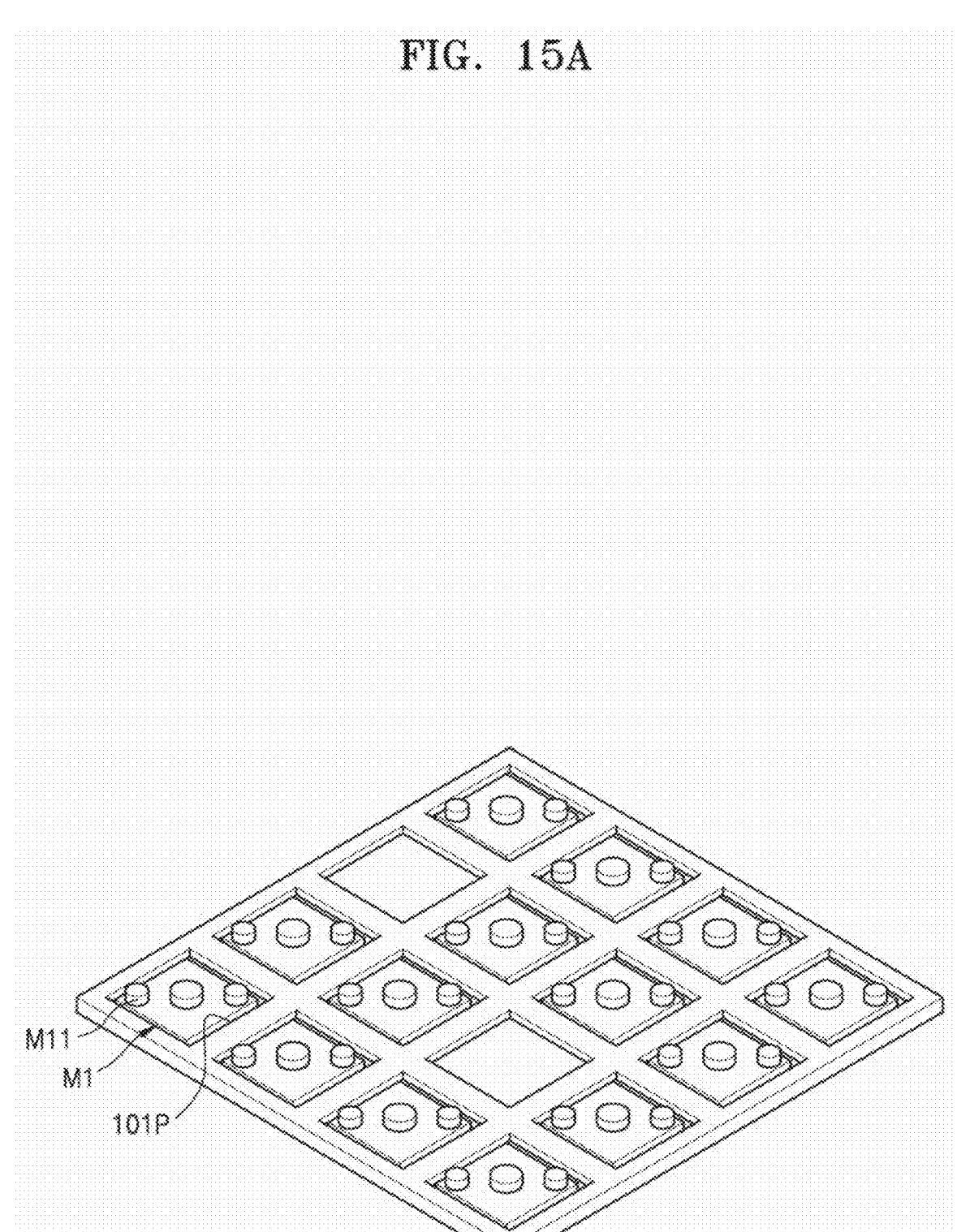
FIGS. 15A to 15H are diagrams illustrating a complementing operation of a mass-transfer according to embodiments.

Referring to FIG. 15A, a mass-transfer method of micro semiconductor chips according to an embodiment may include an operation of transferring the plurality of first micro semiconductor chips M1 onto the transfer substrate 11. The operation of transferring the plurality of first micro semiconductor chips M1 onto the transfer substrate 11 may be performed by a fluidic self assembly method. The fluidic self assembly method may be substantially the same as described with reference to FIGS. 2 to 4, and thus the redundant description thereof is omitted. The first micro semiconductor chip M1 onto the transfer substrate 11 may be disposed so that the first electrode layer M11 faces upward.

Figure 15B:
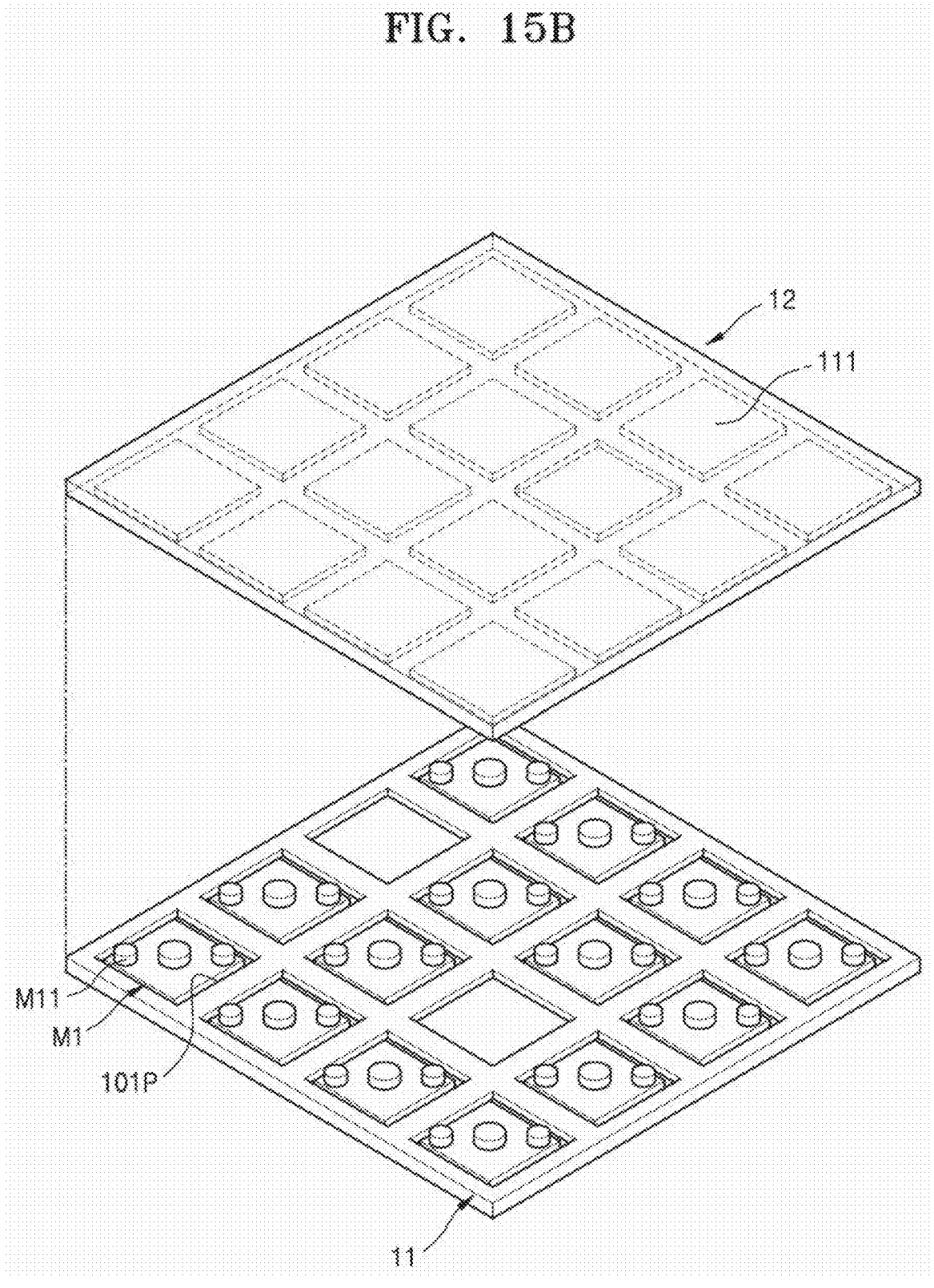

Referring to FIG. 15B, the driving substrate 12 may be aligned on the transfer substrate 11. The driving substrate 12 may include a transistor electrically connectable to the first micro semiconductor chip M1. A position of at least one of the transfer substrate 11 or the driving substrate 12 may be adjusted so that a groove 101p of the transfer substrate 11 overlaps a groove 111 of the driving substrate 12.

Figure 15C:
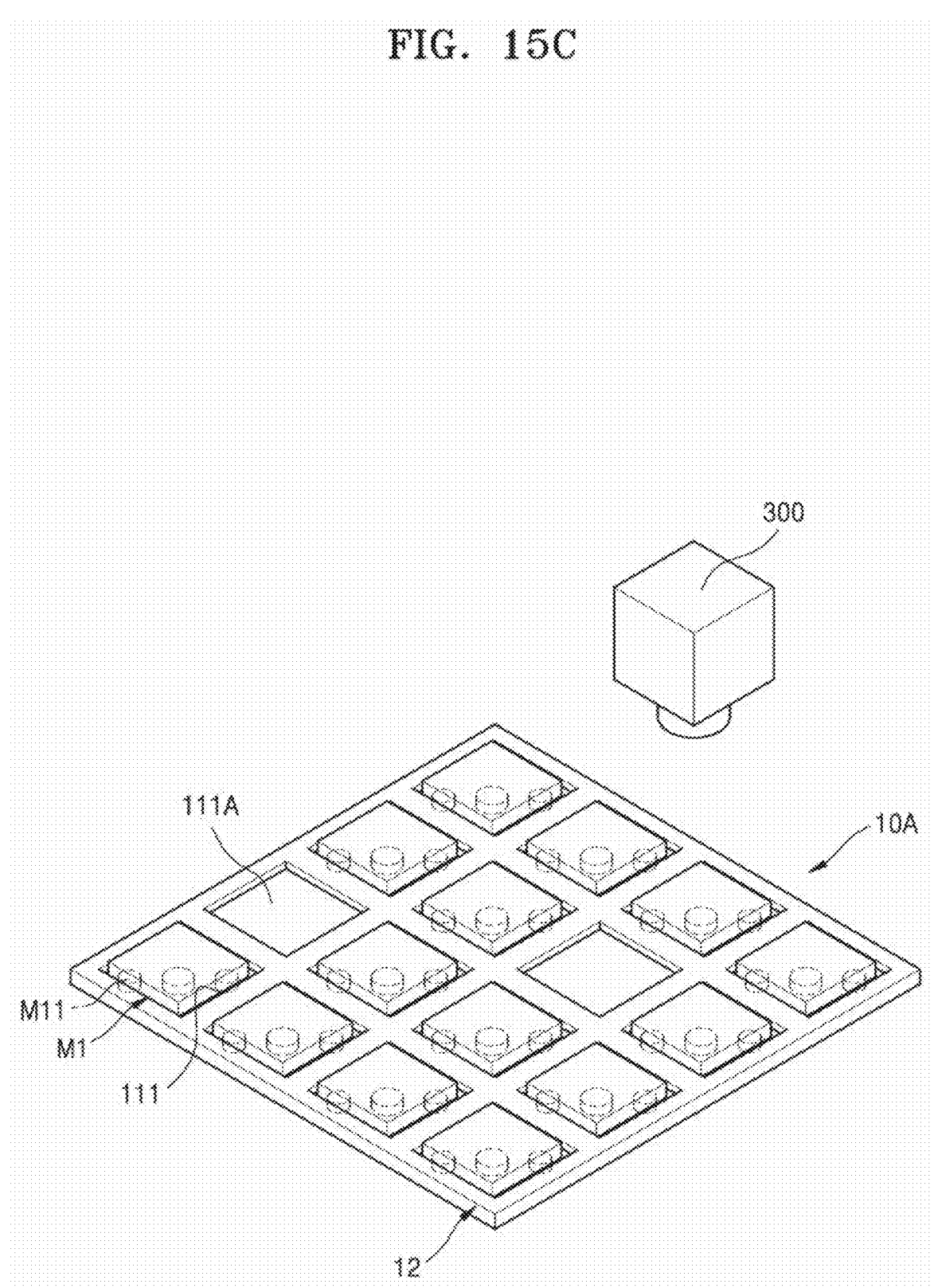

Referring to FIG. 15C, the first micro semiconductor chip M1 assembled in the groove 111 of the driving substrate 12 may be transferred to the groove 101p of the transfer substrate 11. As an example in this regard, the driving substrate 12 and the transfer substrate 11 may be positioned upside down so that the driving substrate 12 is located on a lower portion of the transfer substrate 11. The first micro semiconductor chip M1 assembled in the groove 101p of the transfer substrate 11 may be moved to the groove 111 of the driving substrate 12 by gravity. Thus, the first micro semiconductor chip M1 transferred onto the transfer substrate 11 may be transferred onto the driving substrate 12. Here, the driving substrate 12 may correspond to a first substrate 10A, and the groove 111 of the driving substrate 12 may correspond to the first groove 101 of the first substrate 10A.

The first micro semiconductor chip M1 may be disposed so that the first electrode layer M11 faces downward in a process of transferring the first micro semiconductor chip M1 onto the driving substrate 12 from the transfer substrate 11. The first micro semiconductor chip M1 assembled in the groove 111 of the driving substrate 12 may be disposed so that the first electrode layer M11 faces downward.

The vision detection module 300 may capture images of, or data about, the driving substrate 12 wholly or partially. The vision detection module 300 may detect information about the empty groove 111A to which the first micro semiconductor chip M1 is not transferred among the grooves 111 of the driving substrate 12.

Figure 15D:
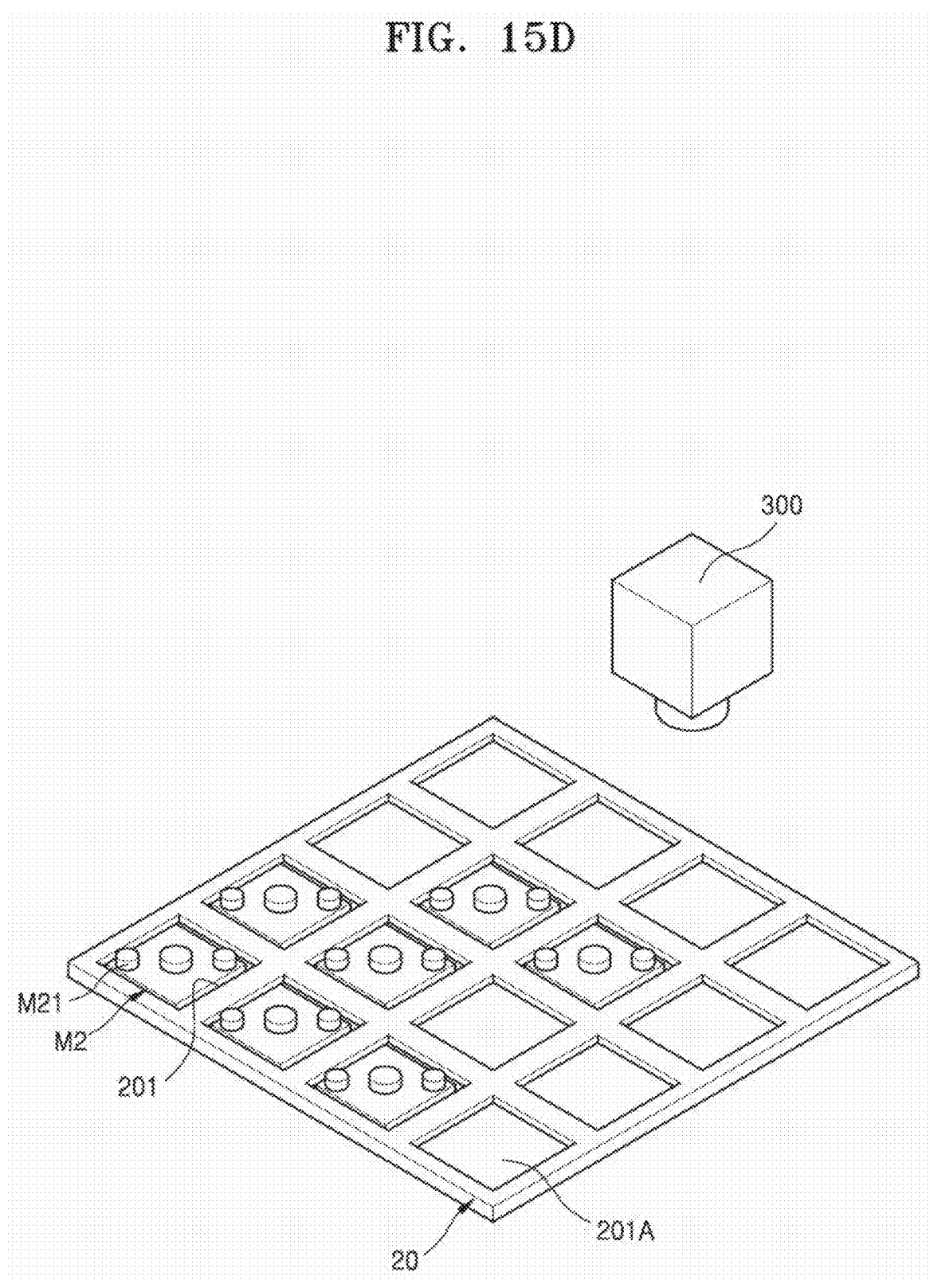

Referring to FIG. 15D, at operation S20 of complementing the empty first groove 101A according to the embodiment, the second micro semiconductor chip M2 may be transferred onto the second substrate 20 in the same manner as the transfer method of the transfer substrate 11. The transfer method of the second micro semiconductor chip M2 onto the second substrate 20 is the same as described with reference to FIG. 6A, and thus, a redundant description thereof is omitted.

Figure 15E:
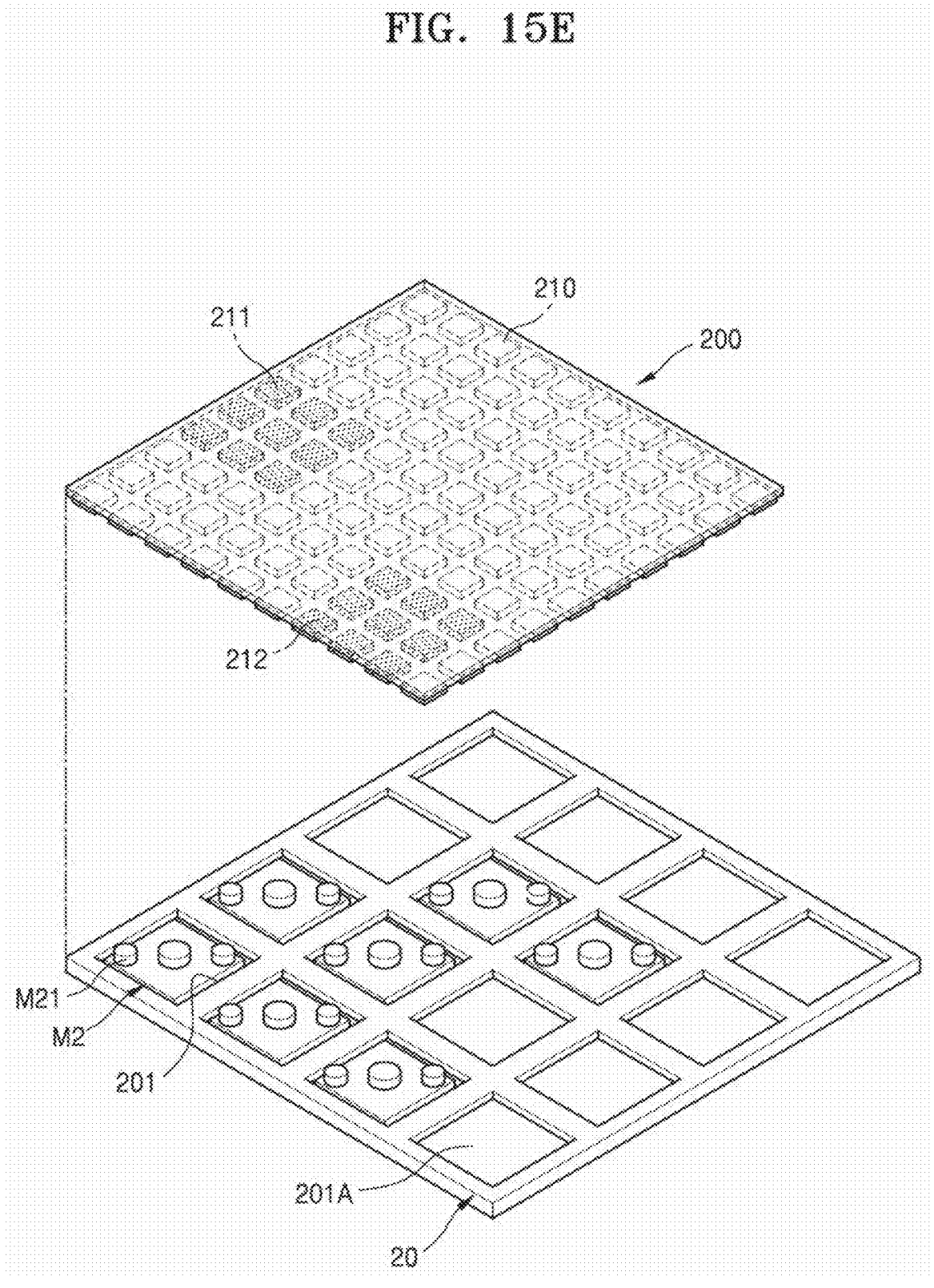

Referring to FIG. 15E, the array module 200 may selectively activate some of the unit cells 210 disposed to face downward. The array module 200 may selectively activate some of the unit cells 210, based on the information about the empty groove 111A of the driving substrate 12. For example, the array module 200 may selectively activate the plurality of unit cells 210, based on first information about the empty groove 111A of the driving substrate 12 and second information about the second substrate 20. For example, the array module 200 may selectively activate some of the unit cells 210 corresponding to a region in which the positon of the empty groove 111A of the driving substrate 12 overlaps the position of the second groove 201 that is not empty in the second substrate 20.

Accordingly, some of the second micro semiconductor chips M2 transferred onto the second substrate 20 may be adsorbed to the array module 200.

Figure 15F:
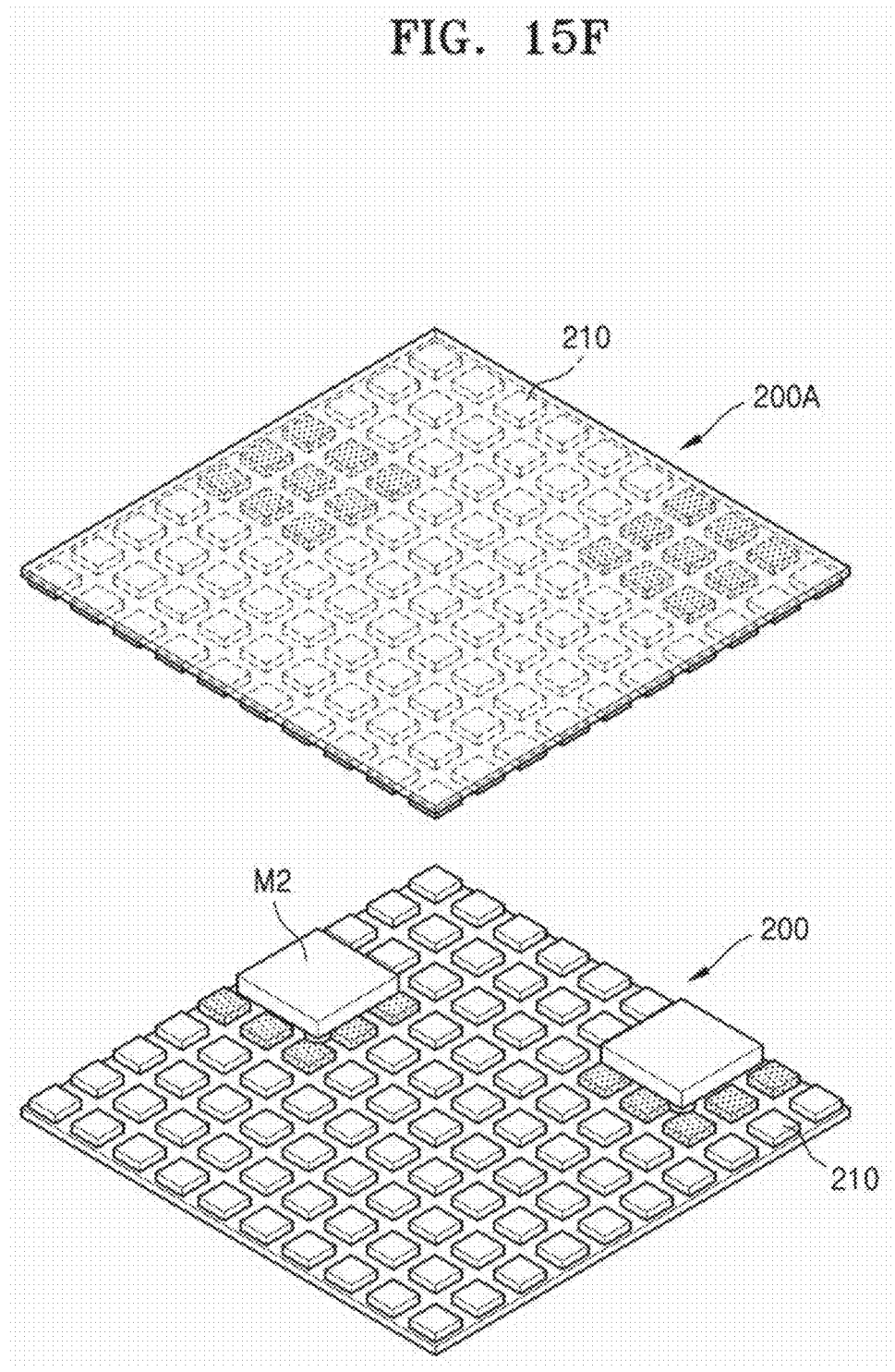

Referring to FIG. 15F, the array module 200 may be turned upside down so that the adsorbed second micro semiconductor chip M2 faces upward. The second micro semiconductor chip M2 adsorbed to the upside down array module 200 may be in a state where the second electrode layer M21 faces downward.

Power may be applied to the unit cell 210 of a second array module 200A disposed on the array module 200. Power may be applied to some of the unit cells 210 of the second array module 200A, but is not limited thereto, and may be applied to all the unit cells 210. Thus, the second micro semiconductor chip M2 may be adsorbed to the second array module 200A. In the second micro semiconductor chip M2 adsorbed to the second array module 200A, the second electrode layer M21 may face downward.

Figure 15G:
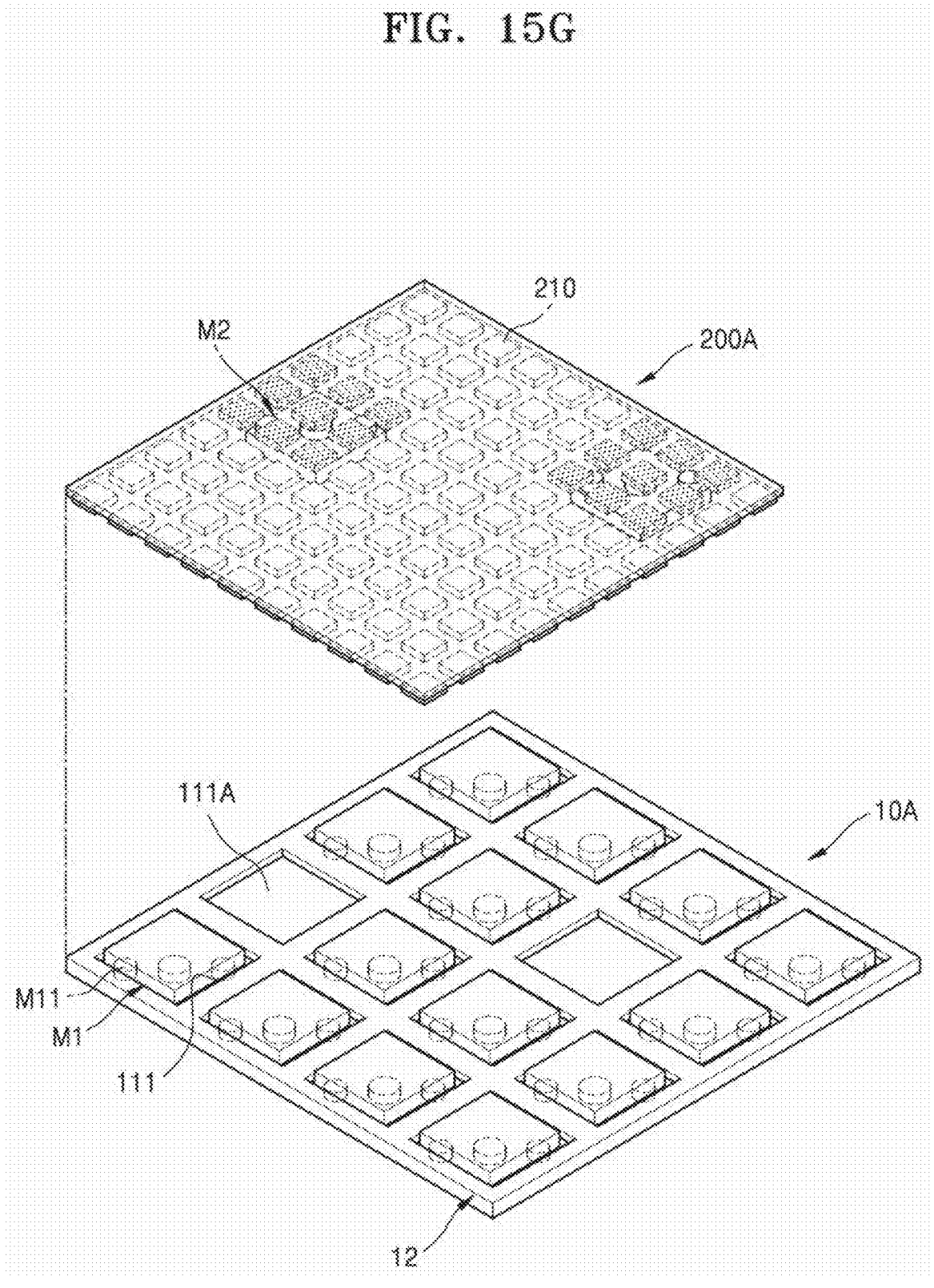

Referring to FIG. 15G, the second array module 200A and the driving substrate 12 may be aligned. The second micro semiconductor chip M2 may be adsorbed to the second array module 200A at a position corresponding to the empty groove 111A of the driving substrate 12.

The second array module 200A may release the electrostatic or electromagnetic force, thereby separating the second micro semiconductor chip M2. Thus, the second micro semiconductor chip M2 including the second electrode layer M21 facing downward may be inserted into the empty groove 111A of the driving substrate 12.

Figure 15H:
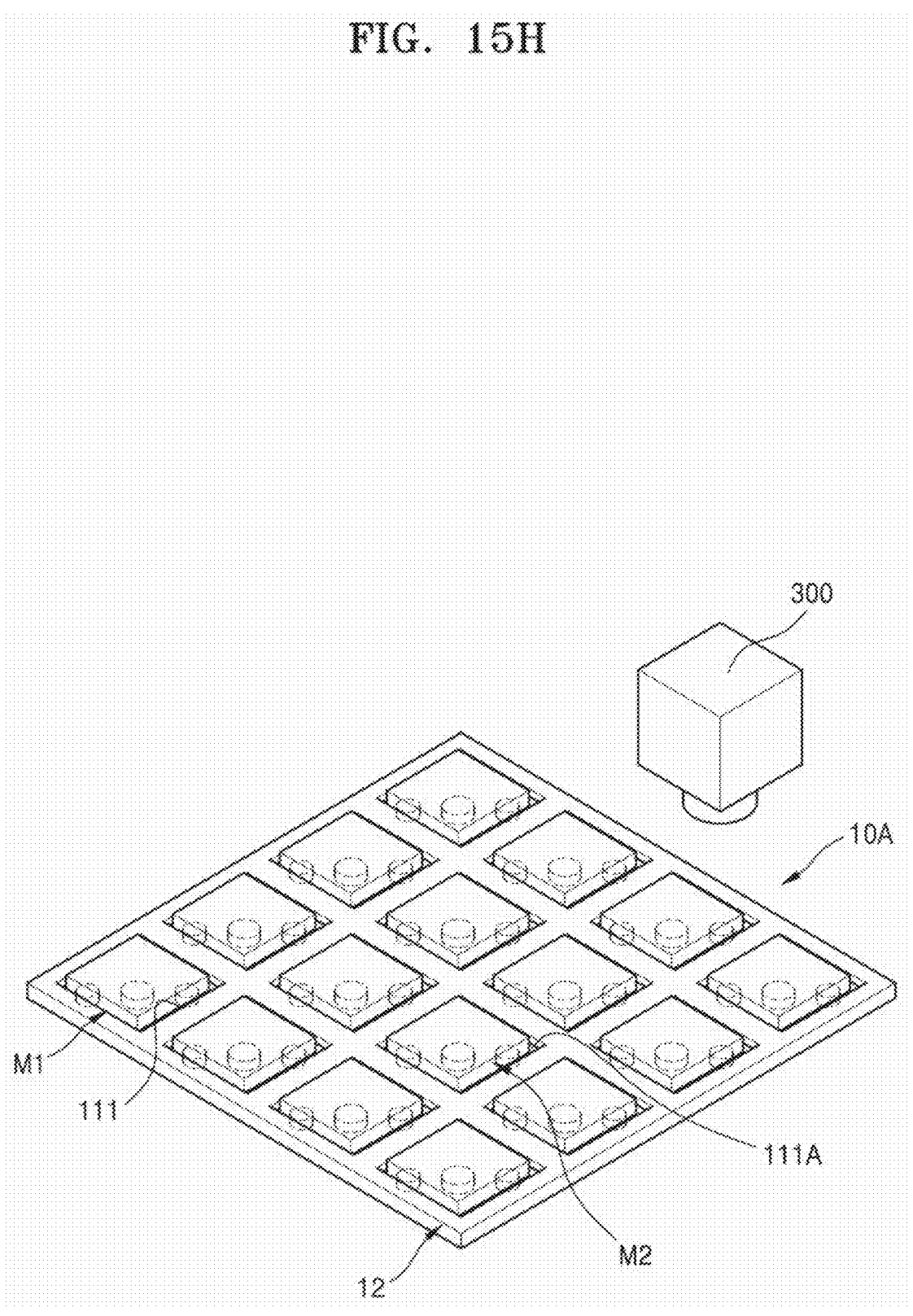

Referring to FIG. 15H, the driving substrate 12 to which the second micro semiconductor chip M2 is complemented by the device for complementing the mass-transfer of micro semiconductor chips may be in the state where the first micro semiconductor chip M1 or the second micro semiconductor chip M2 may be assembled in each of the plurality of grooves 111. The first micro semiconductor chip M1 and the second micro semiconductor chip M2 may be disposed to face the same direction. For example, the first micro semiconductor chip M1 may be disposed so that the first electrode layer M11 faces downward, and the second micro semiconductor chip M2 may be disposed so that the second electrode layer M21 faces downward.

The vision detection module 300 may optically measure a transfer state of the driving substrate 12. The vision detection module 300 may measure states where the first and second micro semiconductor chips M1 and M2 are transferred to the grooves 111 of the driving substrate 12. The controller 400 may determine whether to end operation S20 of complementing the mass-transfer based on the information measured by the vision detection module 300 Determining whether to end operation S20 of complementing the empty first groove 101A is the same as described with reference to FIG. 6E, and thus, the redundant description thereof is omitted.

At a time at which the operation S20 ends, the driving substrate 12 may be in a state in which the first and second micro semiconductor chips M1 and M2 are inserted into more than 99.9% of the plurality of grooves 111.

In embodiments, a function of the array module 200 of selectively transferring micro semiconductor chips to empty grooves by the electrostatic or electromagnetic force has been described in the example above. However, the function of the array module 200 is not limited thereto, and may vary if the function selectively adsorbs and separates a plurality of transferred micro semiconductor chips using the electrostatic force or electromagnetic force. For example, the array module 200 may be used in a cleaning process of removing a micro semiconductor chip of a defective position, rather than a correct position after transfer.

Figure 16A:
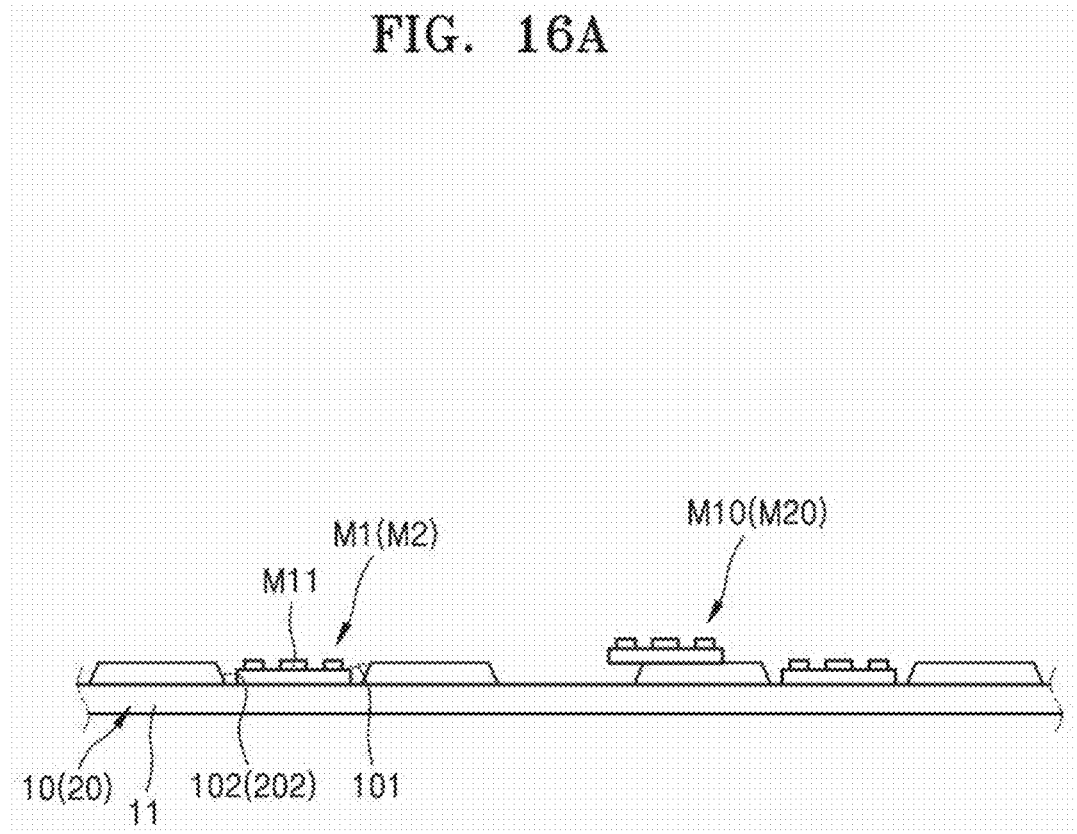
FIGS. 16A and 16B are cross-sectional and perspective views illustrating examples of micro semiconductor chips disposed in defective positions in a mass-transfer process according to embodiments.
Figure 16B:
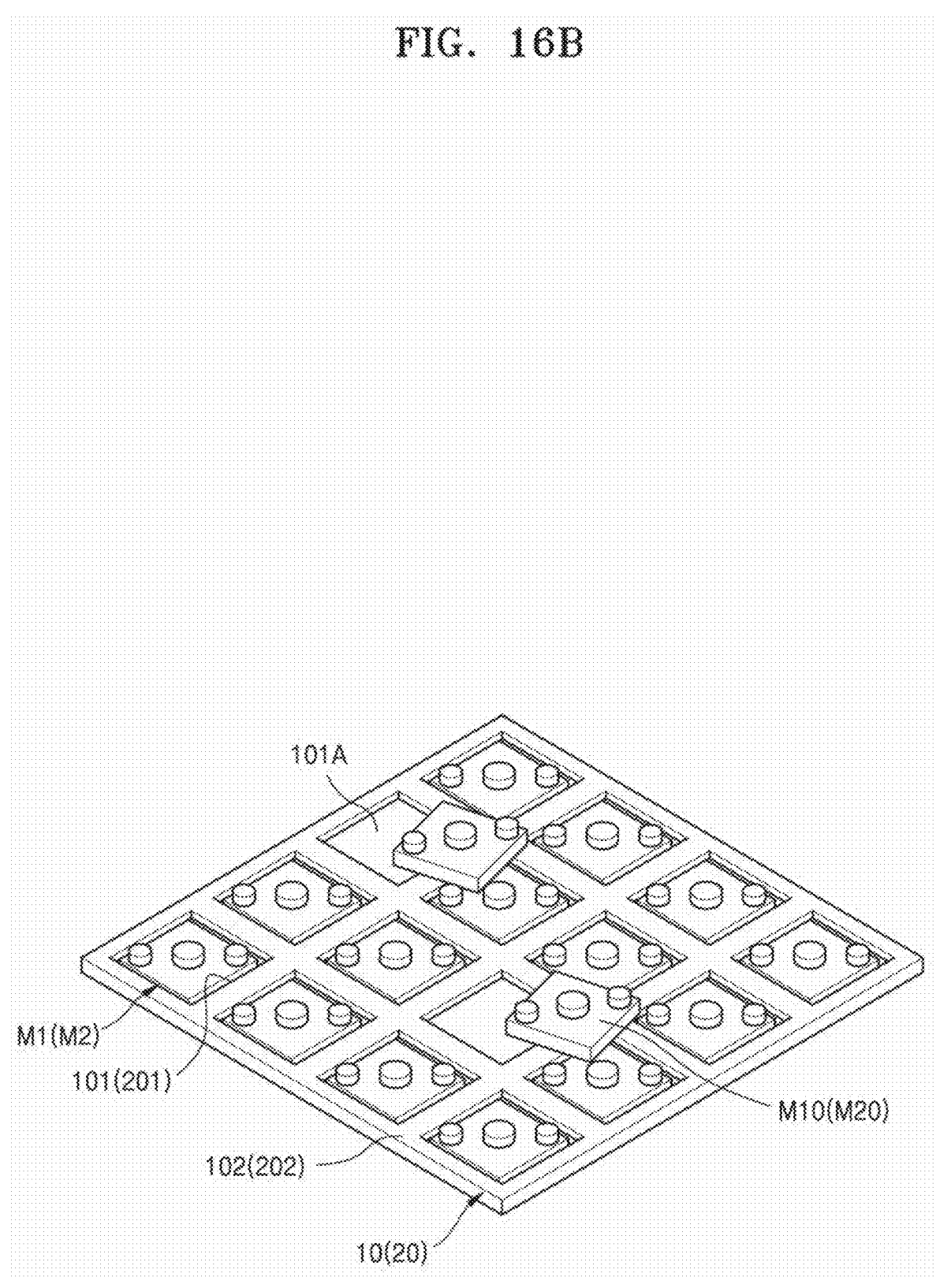
Figure 17A:
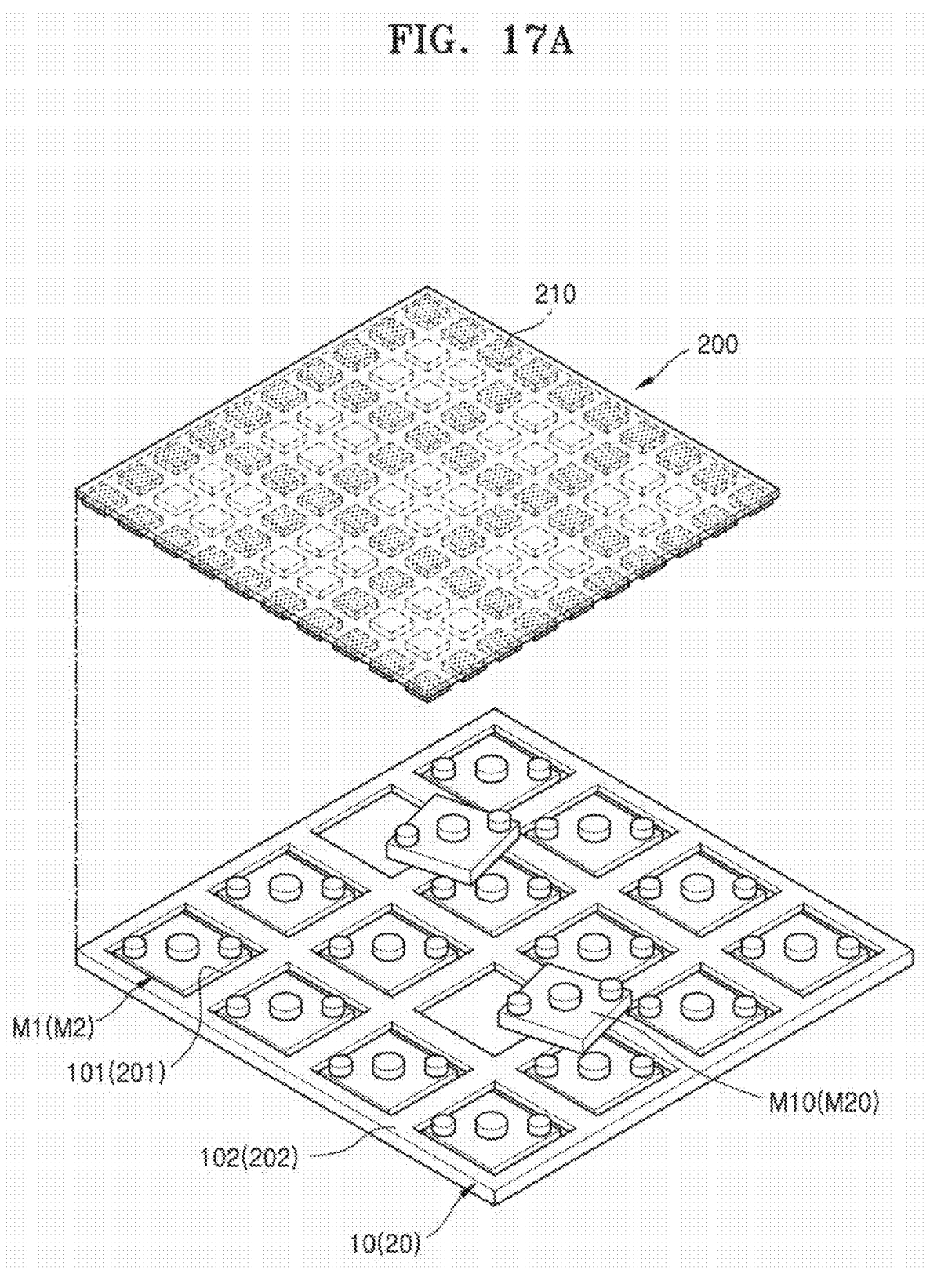
FIGS. 17A and 17B are diagrams illustrating a process in which an array module is used in a cleaning process according to an embodiment.
Figure 17B:
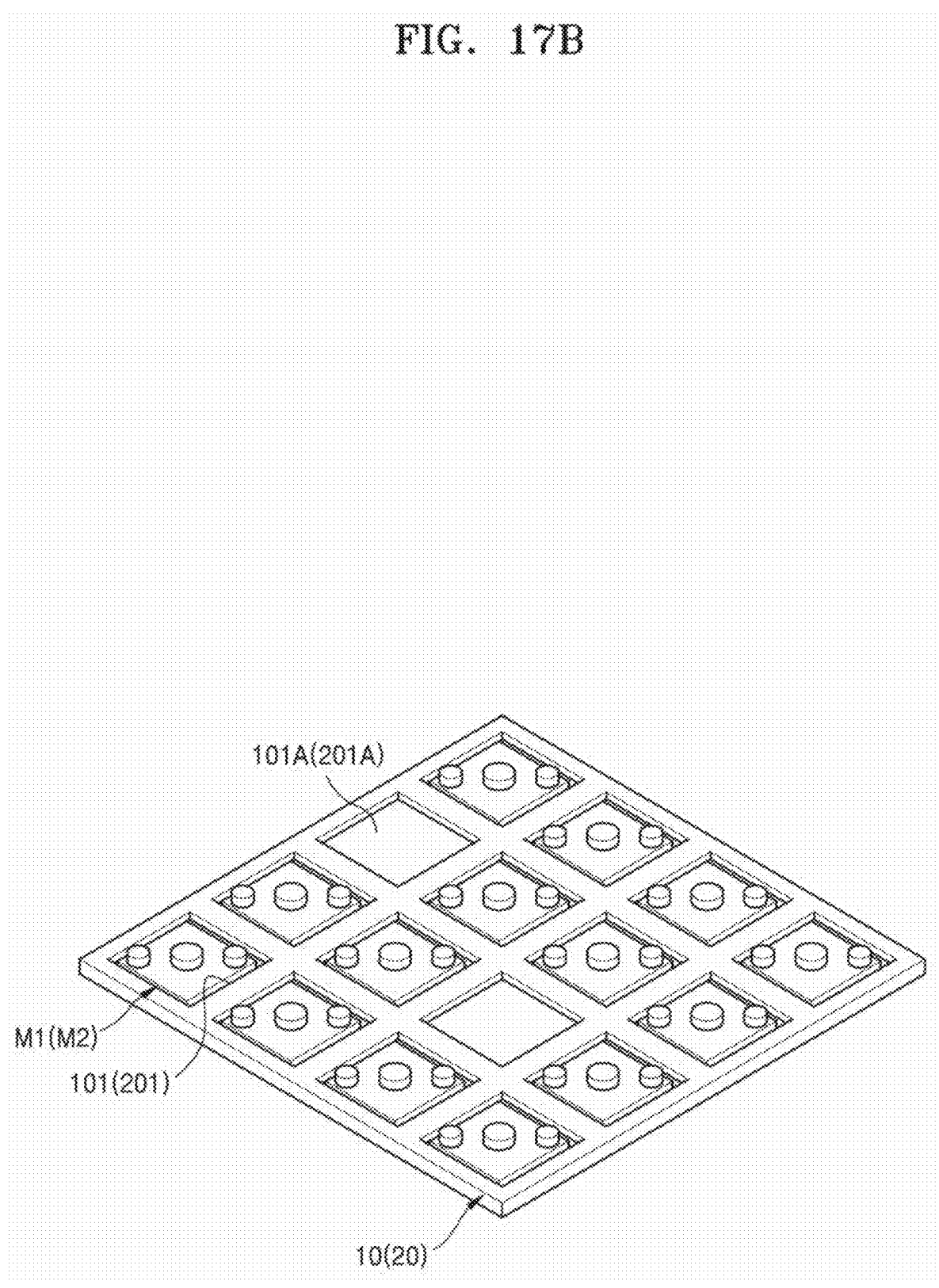

FIGS. 16A and 16B are cross-sectional and perspective views illustrating examples of the first and second micro semiconductor chips M1 and M2 disposed in defective positions in a mass-transfer process. FIGS. 17A and 17B are diagrams illustrating a process in which the array module 200 is used in a cleaning process according to an embodiment.

Referring to FIGS. 16A and 16B, during a process of mass-transferring the plurality of first micro semiconductor chips M1 onto a substrate, some of first micro semiconductor chips M10 may not be inserted into the first groove 101 and may instead be disposed on the barrier ribs 102 between the first grooves 101 by a fluidic self assembly method. Some of the first micro semiconductor chips M10 may be disposed in unintended defective positions in the first substrate 10. This phenomenon may also occur in a process of transferring the second micro semiconductor chips M2 and M20 onto the second substrate 20 by the fluidic self assembly method.

Referring to FIG. 17A, the array module 200 may operate to adsorb the first micro semiconductor chips M10 that is not inserted into the first groove 101. For example, the array module 200 may selectively activate the unit cells 210 located in a region corresponding to the barrier ribs 102 between the first grooves 101 of the first substrate 10. Accordingly, in the array module 200, an electrostatic force or electromagnetic force is not generated in the unit cells 210 of a region corresponding to the first grooves 101 of the first substrate 10, but the electrostatic or electromagnetic force is generated in the unit cells 210 of the region corresponding to the barrier ribs 102 of the first substrate 10.

In the array module 200, adsorption force is selectively applied to the first micro semiconductor chip M10 that is not inserted into the first groove 101, by the electrostatic or electromagnetic force generated in the unit cells 210 of the region corresponding to the barrier ribs 102 of the first substrate 10. Accordingly, the array module 200 may selectively remove the first micro semiconductor chip M10 that is not inserted into the first groove 101 of the first substrate 10.

Accordingly, as shown in FIG. 17B, only the first micro semiconductor chip M1 inserted into the first groove 101 remains in the first substrate 10.

The example of using the array module 200 in the cleaning process with respect to the first substrate 10 is described above, but the use of the array module 200 is not limited thereto. In other words, the array module 200 may be applied to the cleaning process of the second substrate 20 in the same manner.

In the device for complementing the mass-transfer of the micro semiconductor chips, the array module 200 may perform two different functions. For example, the array module 200 may perform a cleaning function of removing a micro semiconductor chip erroneously transferred onto the defective position during the mass-transfer process and a complementing or supplementary function of selectively transferring a micro semiconductor chip to an empty groove by the electrostatic or electromagnetic force. As an example in this regard, the array module 200 may include a cleaning mode and a complementary mode.

When the array module 200 is in the cleaning mode, the array module 200 may selectively generate the electrostatic or electromagnetic force in the region corresponding to barrier ribs defining a plurality of grooves in the substrate. Thus, the array module 200 may adsorb the micro semiconductor chip transferred onto the barrier rib to remove the micro semiconductor chip erroneously transferred onto the substrate. For example, as shown in FIGS. 17A and 17B, the array module 200 may adsorb the first micro semiconductor chip M1 transferred onto the barrier rib 102 of the first substrate 10 by the electrostatic or electromagnetic force, thereby removing the first micro semiconductor chip M1 from the first substrate 10.

When the array module 200 is in the complementary mode, the array module 200 may generate the electrostatic force or electromagnetic force in a region corresponding to at least some of the plurality of grooves in the substrate, thereby adsorbing micro semiconductor chips transferred to the grooves. Accordingly, the micro semiconductor chip transferred onto the substrate may be used to complement another substrate. For example, the array module 200 may be used to complement the second micro semiconductor chip M2 transferred onto the second substrate 20, as shown in FIGS. 6B to 6D.

According to the method of complementing the mass-transfer described above, the first and second micro semiconductor chips M1 and M2 arranged at regular intervals on the first substrate 10 may be used in various devices. The first substrate 10 and the first and second micro semiconductor chips M1 and M2 arranged at regular intervals on the first substrate 10 may be defined as a transfer structure.

For example, when the first substrate 10 is the transfer substrate 11, the first and second micro semiconductor chips M1 and M2 of the transfer substrate 11 may be transferred onto the driving substrate 12 and may be used in an electronic device. For example, when the first substrate 10 is the driving substrate 12, the first and second micro semiconductor chips M1 and M2 of the transfer structure may be used in the electronic device without a separate transfer process.

Figures 18, 19:
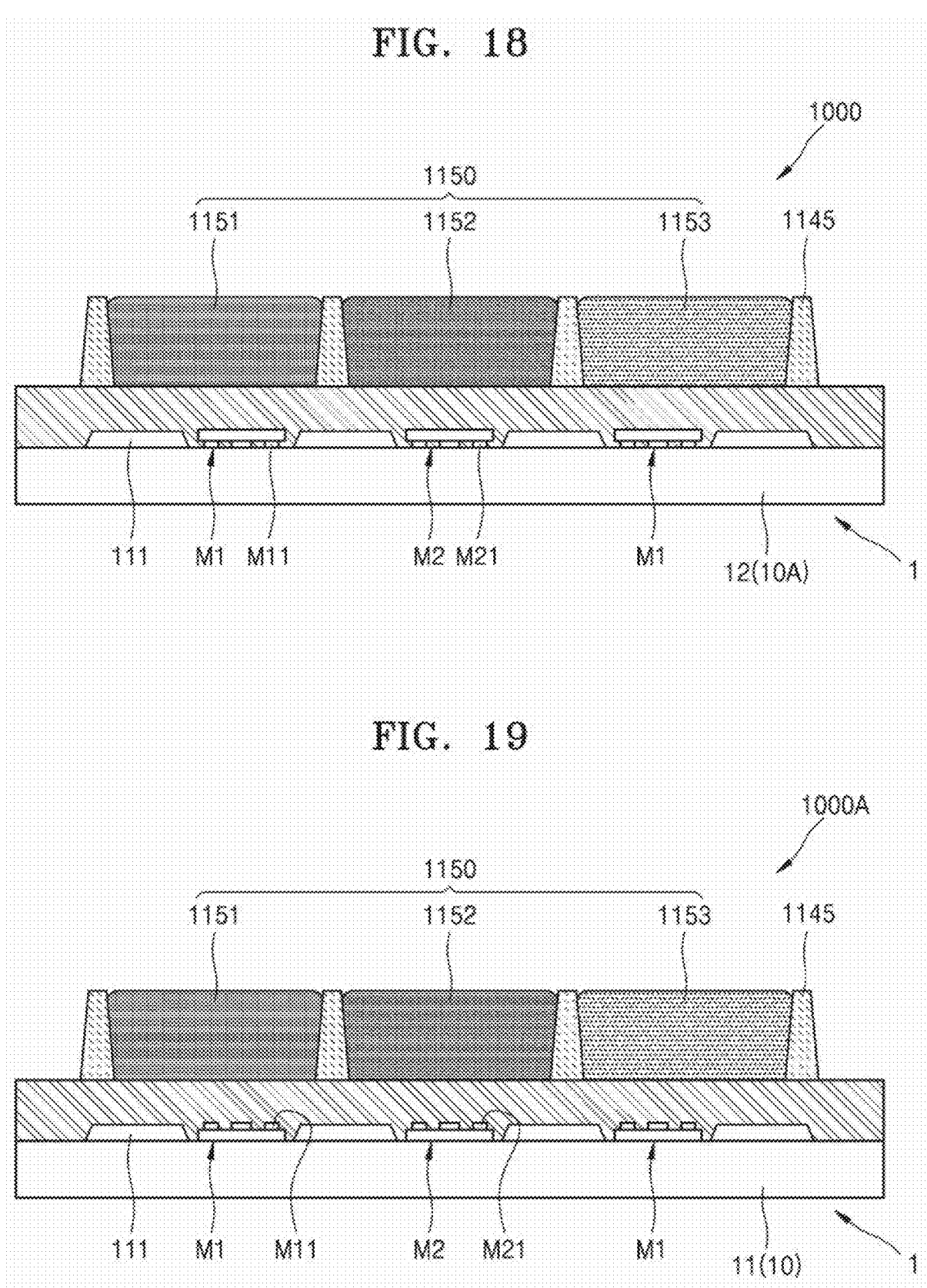
FIGS. 18 and 19 are cross-sectional views of display apparatuses each including a transfer structure according to embodiments.

FIGS. 18 and 19 are cross-sectional views of display apparatuses 1000 and 1000A each including the transfer structure 1 according to the embodiment. Referring to FIGS. 18 and 19, the transfer structure 1 according to an embodiment may be included in each of the display apparatuses 1000 and 1000A. For example, each of the display apparatuses 1000 and 1000A may include the transfer structure 1 and a color conversion layer 1150 disposed on the transfer structure 1.

The color conversion layer 1150 is provided between a barrier rib 1145 and the barrier rib 1145. The first and second micro semiconductor chips M1 and M2 may emit a first color light, for example, a blue light. However, the light emitted from the first and second micro semiconductor chips M1 and M2 is not limited thereto, and the first and second micro semiconductor chips M1 and M2 may also emit light of other wavelengths that may excite the color conversion layer 1150.

The color conversion layer 1150 may include a first color conversion layer 1151 converting or transmitting light emitted from the first and second micro semiconductor chips M1 and M2 into the first color light, a second color conversion layer 1152 converting the light into a second color light, and a third color conversion layer 1153 converting the light into a third color light. The second color light may be green light, and the third color light may be red light.

When the first and second micro semiconductor chips M1 and M2 emit blue light, the first color conversion layer 1151 may include resin that transmits the blue light without a light conversion. The second color conversion layer 1152 may convert the blue light emitted from the first and second micro semiconductor chips M1 and M2 and emit green light. The second color conversion layer 1152 may include quantum dots (QDs) excited by the blue light and emitting the green light. QD may have a core-shell structure including a core portion and a shell portion, or may have a particle structure without a shell. The core-shell structure may be a single-shell or multi-shell structure, such as a double-shell structure.

QD may include a group II-VI series semiconductor, a group III-V series semiconductor, a group IV-VI series semiconductor, a group IV series semiconductor, and/or a graphene QD. QD may include, for example, may include a Cd, Se, Zn, S and/or INP, and may have a diameter equal to or less than tens of nm, for example, a diameter equal to or less than about 10 nm.

The second color conversion layer 1152 may include a phosphor excited by the blue light emitted from the first and second micro semiconductor chips M1 and M2 and emitting the green light.

The third color conversion layer 1153 may convert the blue light emitted from the first and second micro semiconductor chips M1 and M2 into red light and emit the red light. The third color conversion layer 1153 may include QDs of a certain size excited by the blue light and emitting the red light or may include a phosphor excited by the blue light emitted from the first and second micro semiconductor chips M1 and M2 and emitting the red light.

The display apparatuses 1000 and 1000A may emit red, green and blue light through the color conversion layer 1150. In this case, the transfer structure 1 may be applied to an RGB self-luminous micro LED TV. The display apparatuses 1000 and 1000A may be implemented by controlling the plurality of first and second micro semiconductor chips M1 and M2. As described above, the plurality of first and second micro semiconductor chips M1 and M2 transferred onto the first substrate 11 may be electrically connected to each other to perform a function.

Figure 20:
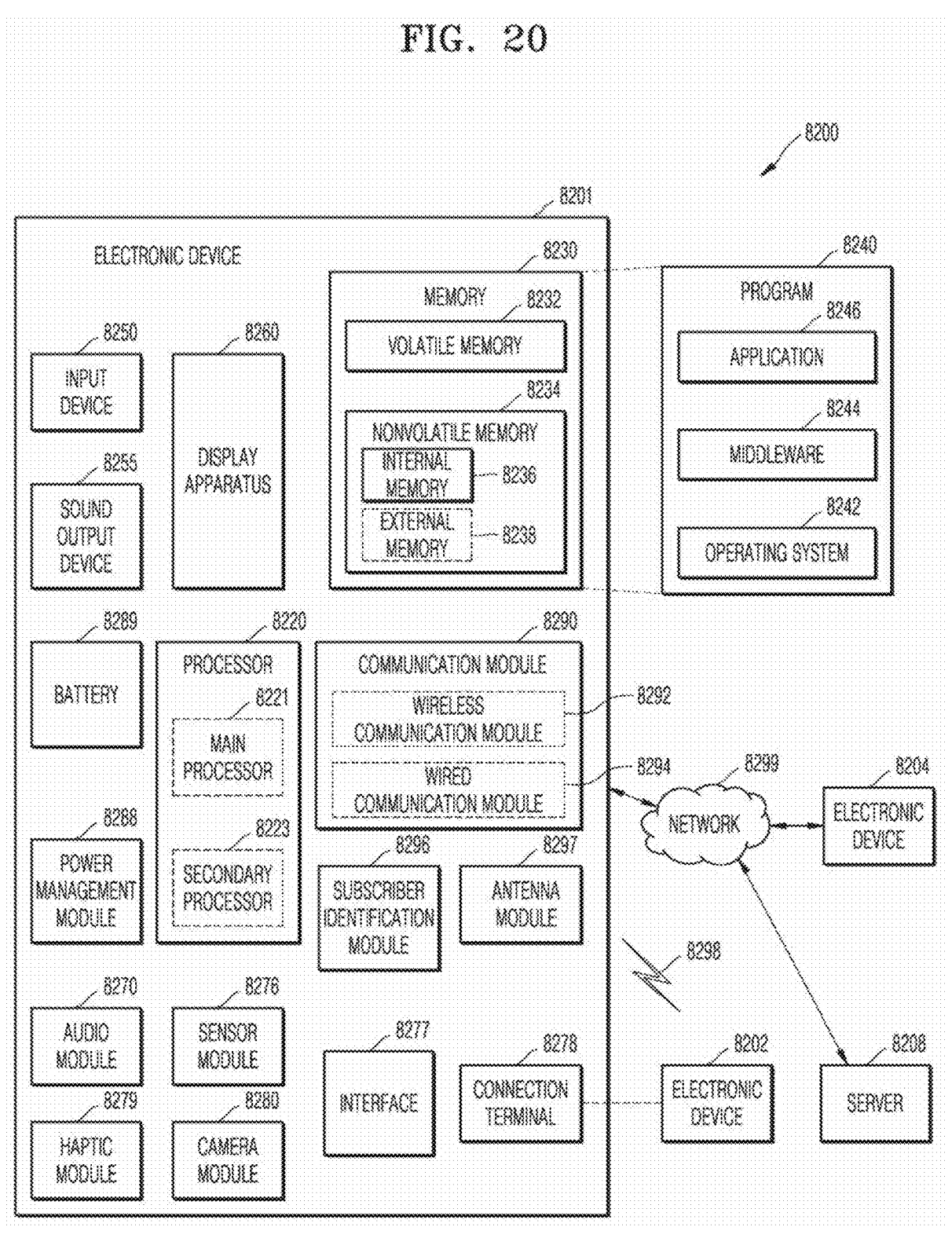
FIG. 20 is a schematic block diagram of an electronic device according to an embodiment.

FIG. 20 is a block diagram of an electronic device including the transfer structure 1 according to an embodiment.

Referring to FIG. 20, an electronic device 8201 may be provided in a network environment 8200. In the network environment 8200, the electronic device 8201 may communicate with another electronic device 8202 through a first network 8298 (such as a short-range wireless communication network, and the like), or communicate with another electronic device 8204 and/or a server 8208 through a second network 8299 (such as a remote wireless communication network). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (fingerprint sensor, iris sensor, illuminance sensor, etc.) may be implemented by being embedded in the display device 8260 (display, etc.).

The processor 8220 may execute software (the program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.)

into the volatile memory 8232, process commands and/or data stored in the volatile memory 8232, and store result data in the nonvolatile memory 8234. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic device 8201 (such as the display device 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.). The data may include, for example, software (such as the program 8240, etc.) and input data and/or output data for commands related thereto. The memory 8230 may include a volatile memory 8232 and/or a nonvolatile memory 8234.

The program 8240 may be stored as software in the memory 8230 and may include an operating system 8242, a middleware 8244, and/or an application 8246.

The input device 8250 may receive commands and/or data to be used for components (such as the processor 8220, etc.) of the electronic device 8201 from outside (a user) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display device 8260 may visually provide information to the outside of the electronic device 8201. The display device 8260 may include a display, a hologram device, or a projector and a control circuit for controlling the device. The display device 8260 may include the transfer structure 1 described above. The display device 8260 may include a touch circuitry set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic devices (such as the electronic device 8202) directly or wirelessly connected to the electronic device 8201.

The sensor module 8276 may detect an operating state (such as power, temperature, and the like) of the electronic device 8201 or an external environmental state (such as a user state, and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the electronic device 8202). The interface 8277 may include a High Definition Multimedia Interface (HDMI), a Universal Serial Bus (USB) interface, an SD card interface, and/or an audio interface.

The connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8388 may be implemented as a part of a Power Management Integrated Circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the electronic device 8202, the electronic device 8204, the server 8208, and the like). The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, and the like). Among these communication modules, a corresponding communication module may communicate with other electronic devices through a first network 8298 (a short-range communication network such as Bluetooth, WiFi Direct, or Infrared Data Association (IrDA)) or a second network 8299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 8292 may check and authenticate the electronic device 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator made of a conductive pattern formed on a substrate (such as PCB, etc.). The antenna module 8297 may include one or a plurality of antennas. If multiple antennas are included, an antenna suitable for a communication method used in a communication network such as the first network 8298 and/or the second network 8299 may be selected from the plurality of antennas by the communication module 8290. Signals and/or power may be transmitted or received between the communication module 8290 and another electronic device through the selected antenna. In addition to the antenna, other components (such as RFIC) may be included as part of the antenna module 8297.

Some of the components are connected to each other and may exchange signals (such as commands, data, and the like) through communication method between peripheral devices (such as bus, General Purpose Input and Output (GPIO), Serial Peripheral Interface (SPI), Mobile Industry Processor Interface (MIPI), and the like).

The command or data may be transmitted or received between the electronic device 8201 and the external electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices 8202, 8204, and 8208. For example, when the electronic device 8201 needs to perform a certain function or service, instead of executing the function or service itself, the electronic device 8201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 21:
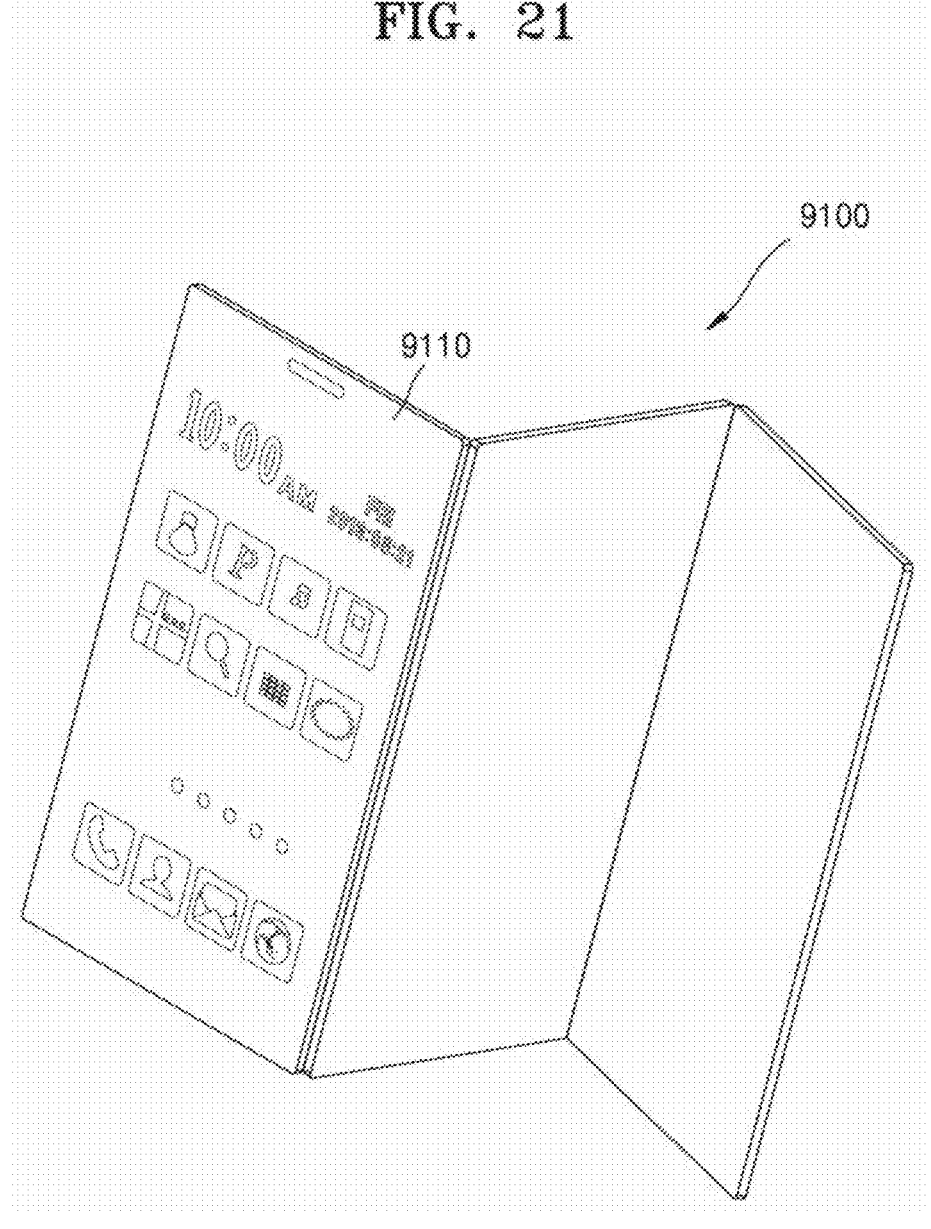
FIG. 21 illustrates an example in which a display apparatus is applied to a mobile device according to an embodiment.

FIG. 21 illustrates an example in which a display apparatus according to an embodiment is applied to a mobile device. The mobile device 9100 may include a display apparatus 9110 according to an embodiment. The display apparatus 9110 may include the transfer structure 1 described above. The display apparatus 9110 may have a foldable structure, for example, a multi-foldable structure. Here, the mobile device 9100 is illustrated as a folder type display, but may be applicable to a general flat panel display.

Figures 22, 23:
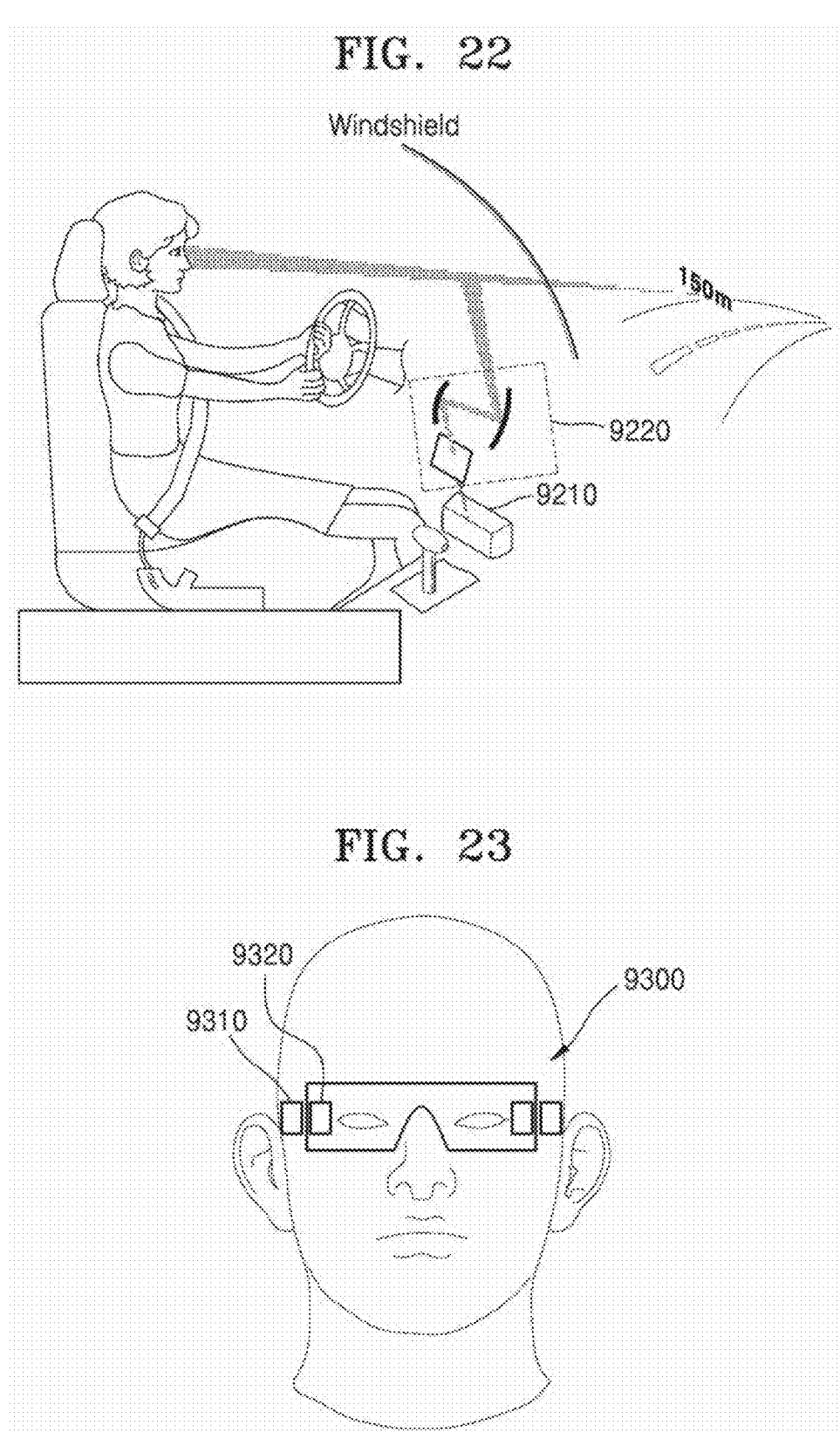
FIG. 22 shows an example in which a display apparatus is applied to a display apparatus for a vehicle according to an embodiment.
FIG. 23 illustrates an example in which a display apparatus is applied to augmented reality glasses or virtual reality glasses according to an embodiment.

FIG. 22 illustrates an example in which the display apparatus according to an embodiment is applied to a vehicle display apparatus. The display apparatus may be applied to a vehicle head-up display apparatus 9200. The vehicle head-up display apparatus 9200 may include a display 9210 provided in an area of the vehicle, and at least one light path changing member 9220 that converts an optical path so that the driver may see the image generated on the display 9210.

FIG. 23 illustrates an example in which a display apparatus according to an embodiment is applied to augmented reality glasses or virtual reality glasses. The augmented reality glasses 9300 may include a projection system 9310 that forms an image, and an element 9320 that guides the image from the projection system 9310 into the user's eye. The projection system 9310 may include the transfer structure 1 described above.

Figures 24, 25:
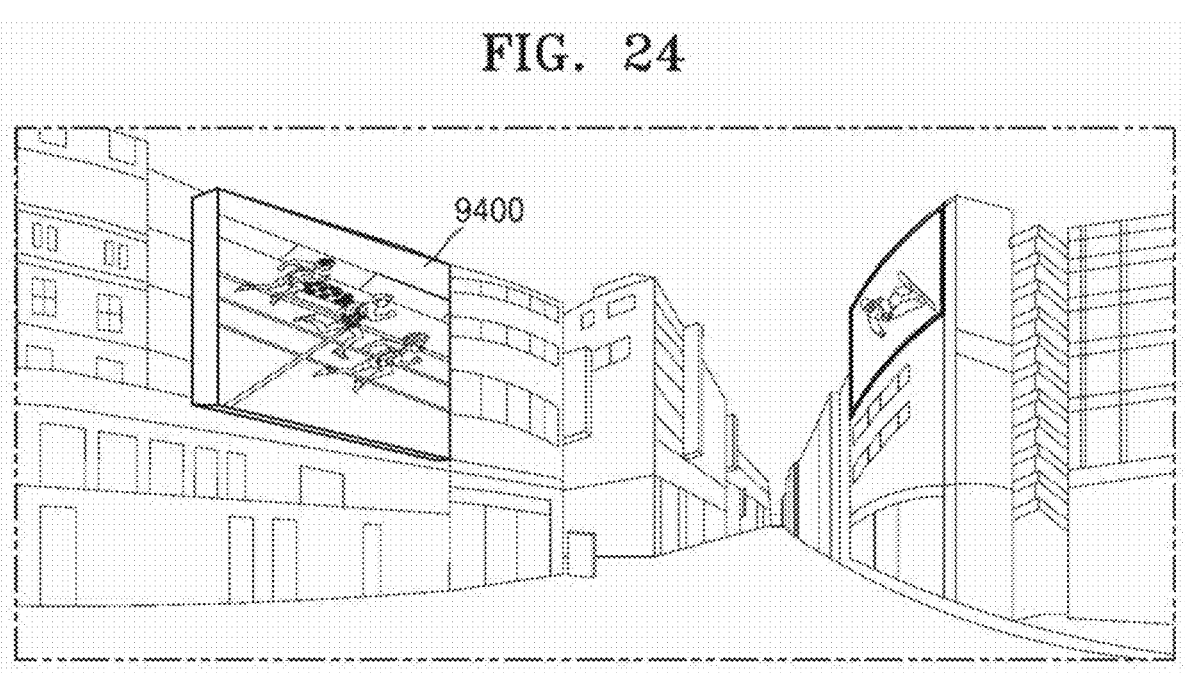
FIG. 24 illustrates an example in which a display apparatus is applied to a signage according to an embodiment.
FIG. 25 illustrates an example in which a display apparatus is applied to a wearable display according to an embodiment.

FIG. 24 shows an example in which the display apparatus according to an embodiment is applied to a large signage. A signage 9400 may be used for outdoor advertisement using a digital information display, and may control advertisement contents and the like through a communication network. The signage 9400 may be implemented, for example, through the electronic device described with reference to FIG. 20.

FIG. 25 illustrates an example in which a display apparatus according to an embodiment is applied to a wearable display. The wearable display 9500 may include the above-described display substrate and microchip, and may be implemented through the electronic device described with reference to FIG. 20.

The display apparatus according to an embodiment may also be applied to various products such as a rollable TV and a stretchable display. Also, the transfer structure 1 according to an embodiment may be applied to a light detection and ranging (LIDAR) device, etc.

The method and apparatus for mass-transferring the micro semiconductor chips according to the embodiments may selectively transfer the micro semiconductor chips using the electrostatic or electromagnetic force to a region to which a micro semiconductor chip is not transferred in a substrate to which the plurality of micro semiconductor chips are mass-transferred, thereby improving the transfer yield of the micro semiconductor chip.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A mass-transfer method of mass-transferring a plurality of micro semiconductor chips, the mass-transfer method comprising:

mass-transferring a plurality of first micro semiconductor chips onto a first substrate such that the plurality of first micro semiconductor chips are disposed in a plurality of first grooves of the first substrate;

determining whether an empty first groove is present in the first substrate, wherein the plurality of first micro semiconductor chips are not disposed in the plurality of first grooves; and positioning a second micro semiconductor chip in the empty first groove, wherein the second micro semiconductor chip is identical to a first micro semiconductor chip from among the plurality of first micro semiconductor chips, wherein the positioning comprises:

transferring a plurality of second micro semiconductor chips onto a second substrate separate from the first substrate, wherein the second micro semiconductor chip is included in the plurality of second micro semiconductor chips;

adsorbing the second micro semiconductor chip from the second substrate; and positioning the adsorbed second micro semiconductor chip in the empty first groove, using an electrostatic force or an electromagnetic force.

2. The mass-transfer method of claim 1, wherein the plurality of first micro semiconductor chips are transferred onto the first substrate by a fluidic self assembly method, and wherein the plurality of second micro semiconductor chips are transferred onto the second substrate by the fluidic self assembly method.

3. The mass-transfer method of claim 2, wherein an upper surface of the first micro semiconductor chip has a different interfacial energy than a lower surface of the first micro semiconductor chip, wherein an upper surface of the second micro semiconductor chip has the different interfacial energy than a lower surface of the second micro semiconductor chip, wherein the first micro semiconductor chip is disposed in a first groove of the plurality of first grooves such that the upper surface of the second micro semiconductor chip faces in a first direction, and wherein the second micro semiconductor chip is positioned in the empty first groove such that the upper surface of the second micro semiconductor chip faces in the first direction.

4. The mass-transfer method of claim 1, wherein the determining comprises detecting first information about a position of the empty first groove on the first substrate, and wherein the second micro semiconductor chip is positioned in the empty first groove based on the detected first information.

5. The mass-transfer method of claim 4, wherein the positioning comprises:

adsorbing at least some of the plurality of second micro semiconductor chips from the second substrate to a specific region of an electromagnetic array using the electrostatic force or the electromagnetic force selectively generated in the specific region by the electromagnetic array, and separating the second micro semiconductor chip from the electromagnetic array such that the second micro semiconductor chip is positioned in the empty first groove of the first substrate.

6. The mass-transfer method of claim 5, wherein the adsorbing comprises:

aligning the electromagnetic array on the second substrate, and selectively generating the electrostatic force or the electromagnetic force in regions corresponding to the empty first groove, based on the detected first information.

7. The mass-transfer method of claim 6, wherein the separating of the second micro semiconductor chip comprises:

aligning the electromagnetic array and the first substrate such that the second micro semiconductor chip adsorbed to the electromagnetic array is opposed to the empty first groove, and positioning the adsorbed second micro semiconductor chip in the empty first groove by removing the electrostatic force or the electromagnetic force generated in the electromagnetic array.

8. The mass-transfer method of claim 5, wherein the adsorbing of the at least some of the plurality of second micro semiconductor chips comprises:

aligning the electromagnetic array on the second substrate, adsorbing the plurality of second micro semiconductor chips transferred onto the second substrate, by generating the electrostatic force or the electromagnetic force in an entire region of the electromagnetic array, inverting the electromagnetic array such that the adsorbed plurality of second micro semiconductor chips face upward, and rearranging the plurality of second micro semiconductor chips by selectively generating the electrostatic force or the electromagnetic force in a region corresponding to the empty first groove of the electromagnetic array, based on the detected first information.

9. The mass-transfer method of claim 5, wherein after the mass-transferring, a misplaced first micro semiconductor chip is disposed on a region of the first substrate other than the plurality of first grooves, and wherein the method further comprises removing the misplaced first micro semiconductor chip using the electromagnetic array.

10. The mass-transfer method of claim 9, wherein the first substrate includes a barrier rib defining the plurality of first grooves, wherein the misplaced first micro semiconductor chip is transferred onto the barrier rib during the mass-transferring, and wherein the method further comprises selectively removing the misplaced first micro semiconductor chip from the barrier rib using the electromagnetic array by generating the electrostatic force or the electromagnetic force in a region of the electromagnetic array overlapping the barrier rib.

11. The mass-transfer method of claim 1, further comprising transferring the plurality of first micro semiconductor chips and the second micro semiconductor chip from the first substrate onto a driving substrate.

12. The mass-transfer method of claim 1, wherein a size of each micro semiconductor chip of the plurality of first micro semiconductor chips and the plurality of second micro semiconductor chips is equal to or less than about 1,000 μm.

13. The mass-transfer method of claim 1, wherein each micro semiconductor chip of the plurality of first micro semiconductor chips and the plurality of second micro semiconductor chips is a micro light emitting diode.

14. The mass-transfer method of claim 1, wherein the first substrate includes a transfer substrate or a driving substrate.

15. A method of transferring a plurality of micro semiconductor chips, the method comprising:

mass-transferring a plurality of first micro semiconductor chips into a plurality of first grooves of the first substrate;

detecting an empty first groove of the first substrate, wherein the plurality of first micro semiconductor chips are not disposed in the plurality of first grooves; and mass-transferring at least one second micro semiconductor chip onto a second substrate separate from the first substrate;

adsorbing the at least one second micro semiconductor chip from the second substrate onto an electromagnetic array;

aligning the electromagnetic array with the first substrate such that the adsorbed at least one second micro semiconductor chip is aligned with the empty first groove; and releasing the at least one second micro semiconductor chip from the electromagnetic array such that the at least one second micro semiconductor chip is placed into the empty first groove of the first substrate.

\* \* \* \* \*